US011688540B2

(12) United States Patent
Matsuura et al.

(10) Patent No.: US 11,688,540 B2
(45) Date of Patent: Jun. 27, 2023

(54) ELECTRONIC COMPONENT

(71) Applicant: Murata Manufacturing Co., Ltd., Kyoto-fu (JP)

(72) Inventors: Kouhei Matsuura, Nagaokakyo (JP); Morihiro Hamano, Nagaokakyo (JP); Keiichi Tsuduki, Nagaokakyo (JP)

(73) Assignee: Murata Manufacturing Co., Ltd., Kyoto-fu (JP)

( * ) Notice: Subject to any disclaimer, the term of this patent is extended or adjusted under 35 U.S.C. 154(b) by 782 days.

(21) Appl. No.: 16/670,916

(22) Filed: Oct. 31, 2019

(65) Prior Publication Data
US 2020/0152365 A1   May 14, 2020

(30) Foreign Application Priority Data
Nov. 8, 2018   (JP) ................. 2018-210867

(51) Int. Cl.
| | |
|---|---|
| *H01F 7/00* | (2006.01) |
| *H01F 17/00* | (2006.01) |
| *H01F 41/04* | (2006.01) |
| *H01B 3/12* | (2006.01) |
| *H05K 3/46* | (2006.01) |
| *H05K 1/03* | (2006.01) |
| *C04B 35/00* | (2006.01) |
| *C03C 3/04* | (2006.01) |

(52) U.S. Cl.
CPC ........... *H01F 17/0013* (2013.01); *C03C 3/04* (2013.01); *C04B 35/00* (2013.01); *H01B 3/12* (2013.01);
(Continued)

(58) Field of Classification Search
CPC ............ H01F 17/0013; H01F 17/0033; H01F 41/0233; H01F 41/041; H01F 41/046;
(Continued)

(56) References Cited

U.S. PATENT DOCUMENTS

| 10,181,374 B2 * | 1/2019 | Katsuta ................. H01F 27/292 |
| 11,309,116 B2 * | 4/2022 | Matsuura ............ H01F 17/0033 |

(Continued)

FOREIGN PATENT DOCUMENTS

| CN | 103964824 A | 8/2014 |
| CN | 107039160 A | 8/2017 |

(Continued)

OTHER PUBLICATIONS

An Office Action mailed by China National Intellectual Property Administration dated Mar. 29, 2021, which corresponds to Chinese Patent Application No. 201911080755.6 and is related to U.S. Appl. No. 16/670,916 with English language translation.

(Continued)

*Primary Examiner* — Paul D Kim
(74) *Attorney, Agent, or Firm* — Studebaker & Brackett PC

(57) ABSTRACT

An electronic component that has fewer cracks during production is provided. The electronic component includes an outer electrode on a multilayer body, which includes an inner glass layer, a magnetic material layer on top and bottom surfaces of the inner glass layer, and an outer glass layer on top and bottom surfaces of the magnetic material layer. The insulating layers of the inner glass layer and the outer glass layers contain a dielectric glass material that contains a glass material containing at least K, B, and Si, quartz, and alumina. The glass material content of each insulating layer of the inner glass layer ranges from approximately 60%-65% by weight, the quartz content of each insulating layer of the inner glass layer ranges from approximately 34%-37% by weight, and the alumina content of each insulating layer of the inner glass layer ranges from approximately 0.5%-4% by weight.

13 Claims, 10 Drawing Sheets

(52) U.S. Cl.
CPC ......... *H01F 41/041* (2013.01); *H05K 1/0306* (2013.01); *H05K 3/4629* (2013.01); *C04B 2235/365* (2013.01); *C04B 2237/341* (2013.01); *H01F 2017/002* (2013.01); *H01F 2017/0066* (2013.01); *H01F 2017/0093* (2013.01)

(58) Field of Classification Search
CPC ............... H01F 27/2804; H01F 27/292; H01F 2017/0066; H01F 2017/0093; C03C 3/04; C04B 35/00; H01B 3/12; H05K 1/0306; H05K 3/4629
See application file for complete search history.

(56) References Cited

U.S. PATENT DOCUMENTS

| | | |
|---|---|---|
| 2013/0249661 A1 | 9/2013 | Motomiya et al. |
| 2014/0220364 A1 | 8/2014 | Umemoto et al. |
| 2017/0125154 A1 | 5/2017 | Karino et al. |
| 2017/0125159 A1 | 5/2017 | Karino et al. |

FOREIGN PATENT DOCUMENTS

| | | |
|---|---|---|
| JP | 2004-235494 A | 8/2004 |
| JP | 2012-069754 A | 4/2012 |
| JP | 2014-152059 A | 8/2014 |
| JP | 2017-011103 A | 1/2017 |
| JP | 2017-092061 A | 5/2017 |
| JP | 2017-092434 A | 5/2017 |

OTHER PUBLICATIONS

An Office Action; "Notice of Reasons for Refusal," mailed by the Japanese Patent Office dated Jun. 8, 2021, which corresponds to Japanese Patent Application No. 2018-210867 and is related to U.S. Appl. No. 16/670,916 with English language translation.

* cited by examiner

ELECTRONIC COMPONENT

CROSS-REFERENCE TO RELATED APPLICATION

This application claims benefit of priority to Japanese Patent Application No. 2018-210867, filed Nov. 8, 2018, the entire content of which is incorporated herein by reference.

BACKGROUND

Technical Field

The present disclosure relates to an electronic component and a method for producing an electronic component.

Background Art

Mobile Industry Processor Interface (MIPI) D-PHY has been employed as a digital data transfer standard for connections between a main IC and a display or a camera in mobile devices, and differential signals are transmitted through two transmission lines. Transmission of differential signals generates common mode noise, and a filter (common mode filter) is used to eliminate the noise.

As an example of such a common mode filter, Japanese Unexamined Patent Application Publication No. 2017-011103 discloses a common mode noise filter that includes a first non-magnetic body, a first magnetic body on the bottom surface of the first non-magnetic body, a second magnetic body on the top surface of the first non-magnetic body, a first coil and a second coil composed of Ag embedded in the first non-magnetic body, and a second non-magnetic body formed on at least one of the bottom surface of the first magnetic body and the top surface of the second magnetic body. The first non-magnetic body and the second non-magnetic body are composed of a filler and glass, and the filler content of the second non-magnetic body is lower than the filler content of the first non-magnetic body.

In the production of the common mode noise filter described in Japanese Unexamined Patent Application Publication No. 2017-011103, however, there is a problem that immersion in a plating solution to form an outer electrode tends to cause a crack.

In the common mode noise filter described in Japanese Unexamined Patent Application Publication No. 2017-011103, the non-magnetic body has outward tension due to a difference in thermal expansion coefficient between the non-magnetic body and the magnetic bodies formed on the top surface and the bottom surface of the non-magnetic body, and therefore even slight corrosion by a plating solution is likely to cause a crack in the non-magnetic body. Such a crack is particularly noticeable when a lead-out electrode is disposed on a side surface of a non-magnetic body.

SUMMARY

Accordingly, the present disclosure provides an electronic component that has fewer cracks during production.

An electronic component according to a first embodiment of the present disclosure is an electronic component that includes an outer electrode on a surface of a multilayer body including an inner glass layer, a magnetic material layer on a top surface and a bottom surface of the inner glass layer, and an outer glass layer on a top surface and a bottom surface of the magnetic material layer. The inner glass layer includes a coil multilayer body, a top lead-out electrode layer on a top surface of the coil multilayer body, and a bottom lead-out electrode layer on a bottom surface of the coil multilayer body. The coil multilayer body includes a plurality of coil conductor layers, and each of the coil conductor layers includes a coil conductor having a coil pattern on a surface of an insulating layer. The top lead-out electrode layer includes a lead-out electrode on a surface of an insulating layer. The bottom lead-out electrode layer includes a lead-out electrode on a surface of an insulating layer. The coil multilayer body includes a primary coil conductor layer including a primary coil conductor, a secondary coil conductor layer including a secondary coil conductor, a tertiary coil conductor layer including a tertiary coil conductor, and a parallel primary coil conductor layer including a parallel primary coil conductor stacked in this order on the bottom surface thereof. The outer electrode includes a first outer electrode, a second outer electrode, a third outer electrode, a fourth outer electrode, a fifth outer electrode, and a sixth outer electrode. The primary coil conductor is coupled to the first outer electrode and the fourth outer electrode. The secondary coil conductor is coupled to the second outer electrode and the fifth outer electrode. The tertiary coil conductor is coupled to the third outer electrode and the sixth outer electrode. The parallel primary coil conductor is coupled to the first outer electrode and the fourth outer electrode. The primary coil conductor is connected in parallel to the parallel primary coil conductor. The insulating layers of the inner glass layer and the outer glass layers contain a dielectric glass material that contains a glass material containing at least K, B, and Si, quartz, and alumina. The glass material content of each insulating layer of the inner glass layer ranges from approximately 60% to 65% by weight. The quartz content of each insulating layer of the inner glass layer ranges from approximately 34% to 37% by weight, and the alumina content of each insulating layer of the inner glass layer ranges from approximately 0.5% to 4% by weight.

An electronic component according to a second embodiment of the present disclosure is an electronic component that includes an outer electrode on a surface of a multilayer body including an inner glass layer, a magnetic material layer on a top surface and a bottom surface of the inner glass layer, and an outer glass layer on a top surface and a bottom surface of the magnetic material layer. The inner glass layer includes a coil multilayer body and a lead-out electrode layer on a top surface and/or a bottom surface of the coil multilayer body. The coil multilayer body including a plurality of coil conductor layers. Each of the coil conductor layers includes a coil conductor having a coil pattern on a surface of an insulating layer. The lead-out electrode layer includes a lead-out electrode on a surface of an insulating layer. The coil multilayer body includes a primary coil conductor layer including a primary coil conductor and a secondary coil conductor layer including a secondary coil conductor stacked in this order on the bottom surface thereof. The outer electrode includes a first outer electrode, a second outer electrode, a third outer electrode, and a fourth outer electrode. The primary coil conductor is coupled to the first outer electrode and the third outer electrode. The secondary coil conductor is coupled to the second outer electrode and the fourth outer electrode. The insulating layers of the inner glass layer and the outer glass layers contain a dielectric glass material that contains a glass material containing at least K, B, and Si, quartz, and alumina. The glass material content of each insulating layer of the inner glass layer ranges from approximately 60% to 65% by weight. The quartz content of each insulating layer of the inner glass layer ranges from approximately 34% to 37% by weight, and the alumina content of each insulating layer of the inner glass layer ranges from approximately 0.5% to 4% by weight.

A method for producing an electronic component according to a preferred embodiment of the present disclosure includes preparing a ceramic green sheet A for an inner glass layer, preparing a ceramic green sheet B for a magnetic material layer, preparing a ceramic green sheet C for an outer glass layer, forming a coil conductor pattern on the ceramic green sheet A to form a coil sheet, forming a lead-out electrode pattern on the ceramic green sheet A to form a lead-out electrode sheet, stacking the ceramic green sheet C, the ceramic green sheet B, the lead-out electrode sheet, the coil sheet, the lead-out electrode sheet, the ceramic green sheet B, and the ceramic green sheet C in this order to form a multilayer body, firing the multilayer body, and forming an outer electrode on the fired multilayer body. The ceramic green sheet A contains quartz and alumina as filler components. The quartz constitutes approximately 34% to 37% by weight of the ceramic green sheet A, and the alumina constitutes approximately 0.5% to 4% by weight of the ceramic green sheet A.

The present disclosure can provide an electronic component that has fewer cracks during production.

Other features, elements, characteristics and advantages of the present disclosure will become more apparent from the following detailed description of preferred embodiments of the present disclosure with reference to the attached drawings.

DETAILED DESCRIPTION

Figure 1:
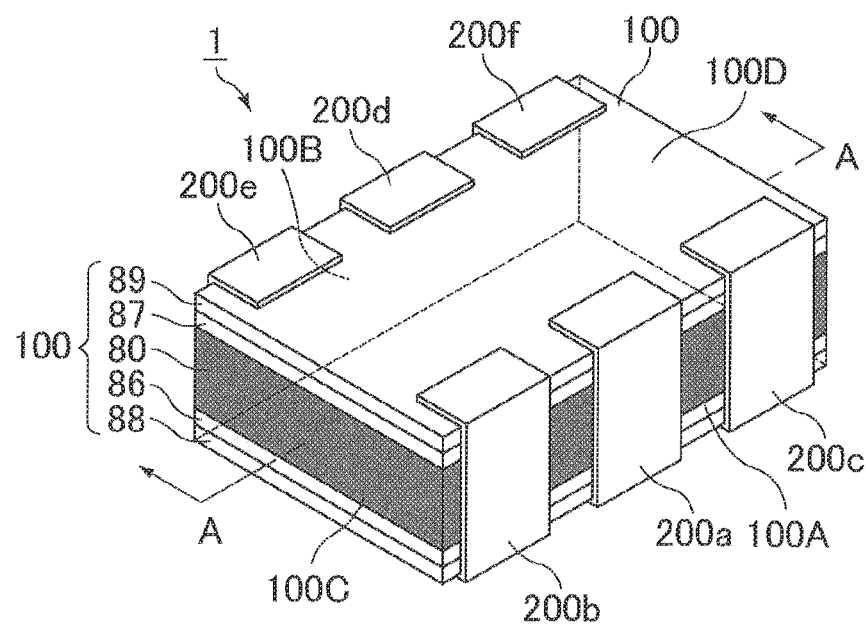
FIG. 1 is a schematic perspective view of an electronic component according to a first embodiment of the present disclosure.

An electronic component according to a preferred embodiment of the present disclosure is described below. However, the present disclosure is not limited to the following embodiments, and various modifications may be made in them without departing from the gist of the present disclosure. A combination of two or more of the following preferred embodiments of the present disclosure also falls within the scope of the present disclosure.

[Electronic Component]

First, an electronic component according to a preferred embodiment of the present disclosure is described below.

First Embodiment

An electronic component according to a first embodiment of the present disclosure is an electronic component that includes an outer electrode on a surface of a multilayer body including an inner glass layer, a magnetic material layer on a top surface and a bottom surface of the inner glass layer, and an outer glass layer on a top surface and a bottom surface of the magnetic material layer. The inner glass layer includes a coil multilayer body, a top lead-out electrode layer on a top surface of the coil multilayer body, and a bottom lead-out electrode layer on a bottom surface of the coil multilayer body. The coil multilayer body includes a plurality of coil conductor layers. Each of the coil conductor layers includes a coil conductor having a coil pattern on a surface of an insulating layer. The top lead-out electrode layer includes a lead-out electrode on a surface of an insulating layer. The bottom lead-out electrode layer including a lead-out electrode on a surface of an insulating layer. The coil multilayer body includes a primary coil conductor layer including a primary coil conductor, a secondary coil conductor layer including a secondary coil conductor, a tertiary coil conductor layer including a tertiary coil conductor, and a parallel primary coil conductor layer including a parallel primary coil conductor stacked in this order on the bottom surface thereof. The outer electrode includes a first outer electrode, a second outer electrode, a third outer electrode, a fourth outer electrode, a fifth outer electrode, and a sixth outer electrode. The primary coil conductor is coupled to the first outer electrode and the fourth outer electrode. The secondary coil conductor is coupled to the second outer electrode and the fifth outer electrode. The tertiary coil conductor is coupled to the third outer electrode and the sixth outer electrode. The parallel primary coil conductor is coupled to the first outer electrode and the fourth outer electrode. The primary coil conductor is connected in parallel to the parallel primary coil conductor. The insulating layers of the inner glass layer and the outer glass layers contain a dielectric glass material that contains a glass material containing at least K, B, and Si, quartz, and alumina. The glass material content of each insulating layer of the inner glass layer ranges from approximately 60% to 65% by weight. The quartz content of each insulating layer of the inner glass layer ranges from approximately 34% to 37% by weight, and the alumina content of each insulating layer of the inner glass layer ranges from approximately 0.5% to 4% by weight.

In the electronic component according to the first embodiment of the present disclosure, the quartz content of each insulating layer of the inner glass layer ranges from approximately 34% to 37% by weight, which is higher than the quartz content in known electronic components. Thus, the inner glass layer has a thermal expansion coefficient (CTE) closer to the thermal expansion coefficient of the magnetic material layers. This can decrease tensile stress on the inner glass layer and decrease cracks caused by contact with a plating solution. If the quartz content of each insulating layer of the inner glass layer is less than approximately 34% by weight, this increases the difference in thermal expansion coefficient from the magnetic material layers and tends to increase cracks. On the other hand, if the quartz content of each insulating layer of the inner glass layer is more than approximately 37% by weight, the inner glass layer has lower sinterability and mechanical strength. In the electronic component according to the first embodiment of the present disclosure, the alumina content of each insulating layer of the inner glass layer ranges from approximately 0.5% to 4% by weight. Thus, a cristobalite phase can be formed in the inner glass layer and can further decrease cracks caused by contact with a plating solution. If the alumina content of each insulating layer of the inner glass layer is less than approximately 0.5% by weight, the inner glass layer is over-sintered, and bubbles are easily formed. On the other hand, if the alumina content of each insulating layer of the inner glass layer is more than 4% by weight, this lowers the sinterability of the inner glass layer, increases the difference in thermal expansion coefficient from the magnetic material layers, and tends to increase cracks.

The outer electrodes of the electronic component according to the first embodiment of the present disclosure are described below. The electronic component according to the first embodiment of the present disclosure includes the first outer electrode, the second outer electrode, the third outer electrode, the fourth outer electrode, the fifth outer electrode, and the sixth outer electrode (hereinafter also collectively referred to as first to sixth outer electrodes) on the surface of the multilayer body. Although the first to sixth outer electrodes may be located at any position on the surface of the multilayer body, considering that the primary coil conductor is coupled to the first outer electrode and the fourth outer electrode, the secondary coil conductor is coupled to the second outer electrode and the fifth outer electrode, and the tertiary coil conductor is coupled to the third outer electrode and the sixth outer electrode, preferably. The first outer electrode faces the fourth outer electrode, the second outer electrode faces the fifth outer electrode, and the third outer electrode faces the sixth outer electrode.

Preferably, the first outer electrode, the second outer electrode, and the third outer electrode are disposed on a first end surface of the multilayer body, and the fourth outer electrode, the fifth outer electrode, and the sixth outer electrode are disposed on a second end surface, which faces the first end surface. The first outer electrode is disposed between the second outer electrode and the third outer electrode on the first end surface, and the fourth outer electrode is disposed between the fifth outer electrode and the sixth outer electrode on the second end surface. When the coil conductors of the coil conductor layers have almost the same cross-sectional area, the first outer electrode and the fourth outer electrode coupled to the primary coil conductor layer and the parallel primary coil conductor layer constitute a series resistance ($R_{DC}$) different from the secondary coil conductor layer and the tertiary coil conductor layer. When the first outer electrode and the fourth outer electrode coupled to the primary coil conductor layer and the parallel primary coil conductor layer are located between the second outer electrode and the third outer electrode and between the fifth outer electrode and the sixth outer electrode, respectively, there is no polarity at the positions of the outer electrodes, and the electronic component can be used without distinction of left and right.

The outer electrodes of the electronic component according to the first embodiment of the present disclosure are described below with reference to FIG. 1. FIG. 1 is a schematic perspective view of the electronic component according to the first embodiment of the present disclosure. As illustrated in FIG. 1, an electronic component 1 includes a first outer electrode 200a, a second outer electrode 200b, a third outer electrode 200c, a fourth outer electrode 200d, a fifth outer electrode 200e, and a sixth outer electrode 200f on end surfaces of a multilayer body 100. The first outer electrode 200a, the second outer electrode 200b, and the third outer electrode 200c are disposed on a first end surface 100A, and the fourth outer electrode 200d, the fifth outer electrode 200e, and the sixth outer electrode 200f are disposed on a second end surface 100B facing the first end surface 100A. The first outer electrode 200a is located between the second outer electrode 200b and the third outer electrode 200c, and the fourth outer electrode 200d is located between the fifth outer electrode 200e and the sixth outer electrode 200f. Although the first to sixth outer electrodes 200a to 200f are partly formed on a bottom surface 100C and a top surface 100D of the multilayer body 100 in the electronic component 1 illustrated in FIG. 1, no outer electrode may be formed on the bottom surface 100C or the top surface 100D of the multilayer body 100. The multilayer body 100 includes an inner glass layer 80, magnetic material layers (87, 86) on the top surface and the bottom surface of the inner glass layer 80, and outer glass layers (89, 88) on the top surface and the bottom surface of the magnetic material layers. More specifically, the multilayer body 100 includes the inner glass layer 80, the top magnetic material layer 87 on the top surface of the inner glass layer 80, the top outer glass layer 89 on the top surface of the top magnetic material layer 87, the bottom magnetic material layer 86 on the bottom surface of the inner glass layer 80, and the bottom outer glass layer 88 on the bottom surface of the bottom magnetic material layer 86.

The inner glass layer of the electronic component according to the first embodiment of the present disclosure is described below. The inner glass layer includes a coil multilayer body, a top lead-out electrode layer on a top surface of the coil multilayer body, and a bottom lead-out electrode layer on a bottom surface of the coil multilayer body, the coil multilayer body including a plurality of coil conductor layers, each of the coil conductor layers including a coil conductor having a coil pattern on a surface of an insulating layer, the top lead-out electrode layer including a lead-out electrode on a surface of an insulating layer, the bottom lead-out electrode layer including a lead-out electrode on a surface of an insulating layer.

In the electronic component according to the first embodiment of the present disclosure, the coil multilayer body includes the primary coil conductor layer including the primary coil conductor, the secondary coil conductor layer including the secondary coil conductor, the tertiary coil conductor layer including the tertiary coil conductor, and the parallel primary coil conductor layer including the parallel primary coil conductor stacked in this order on the bottom surface thereof.

In the electronic component according to the first embodiment of the present disclosure, the inner glass layer may further include an insulator layer. The insulator layer is preferably formed on the bottom surface of the bottom lead-out electrode layer and/or the top surface of the top lead-out electrode layer.

Figure 2:
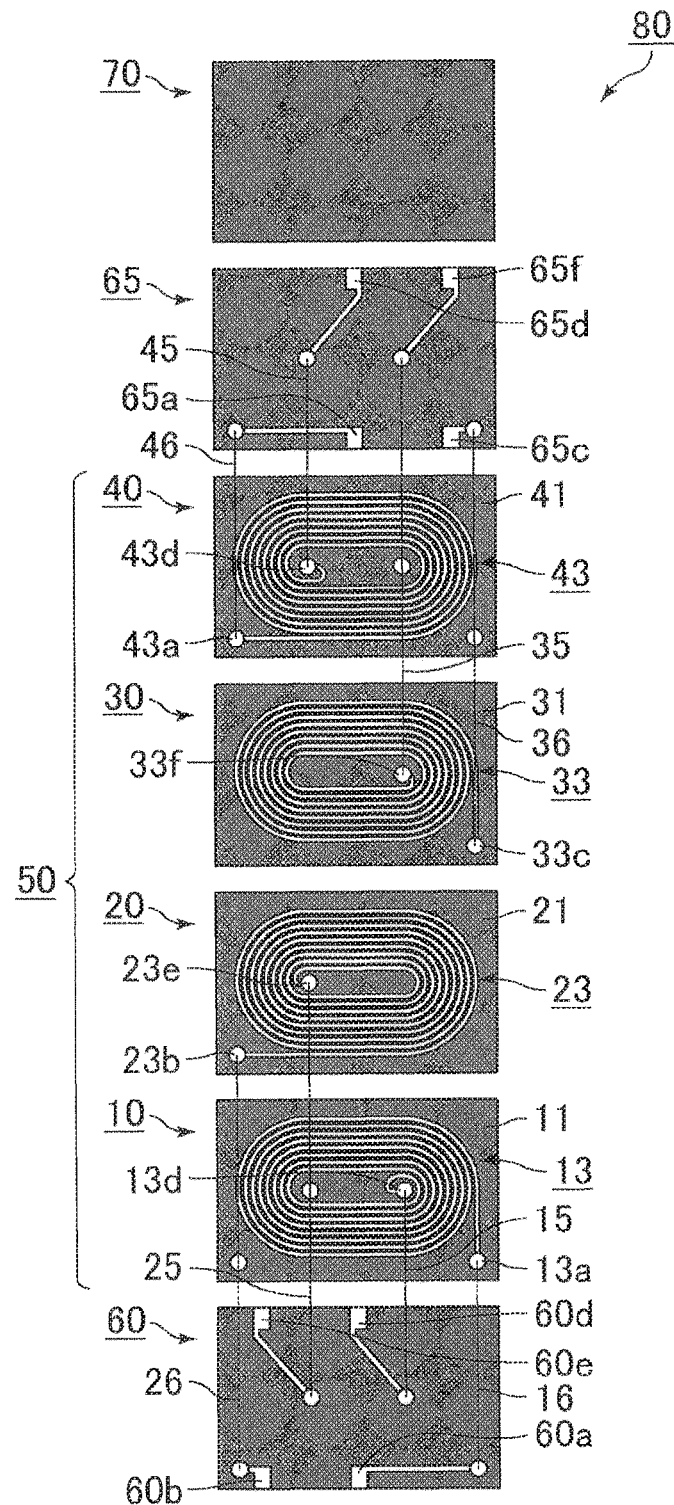
FIG. 2 is a schematic explanatory view of each layer of an inner glass layer of the electronic component according to the first embodiment of the present disclosure.
Figure 3:
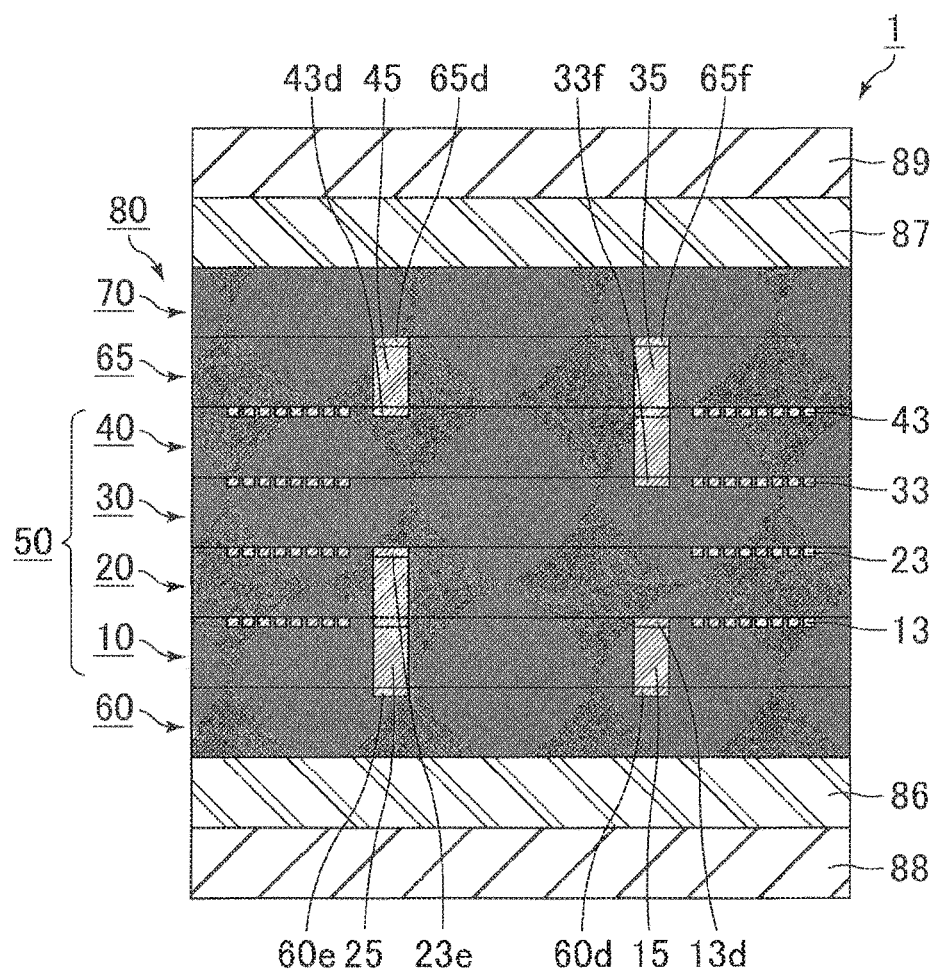
FIG. 3 is a cross-sectional view taken along the line A-A of FIG. 1.

The structure of the inner glass layer is described below with reference to FIGS. 2 and 3. FIG. 2 is a schematic explanatory view of each layer of an inner glass layer of the electronic component according to the first embodiment of the present disclosure. FIG. 3 is a cross-sectional view taken along the line A-A of FIG. 1. As illustrated in FIG. 2, the inner glass layer 80 includes a bottom lead-out electrode layer 60, a primary coil conductor layer 10, a secondary coil conductor layer 20, a tertiary coil conductor layer 30, a parallel primary coil conductor layer 40, a top lead-out electrode layer 65, and an insulator layer 70 stacked in this order on the bottom surface thereof. The primary coil conductor layer 10, the secondary coil conductor layer 20, the tertiary coil conductor layer 30, and the parallel primary coil conductor layer 40 are also collectively referred to as a coil multilayer body 50. Lead-out electrodes 60a, 60b, 60d, 60e, 65a, 65c, 65d, and 65f for coupling with the outer electrodes are disposed on the bottom lead-out electrode layer 60 and on the top lead-out electrode layer 65 and are exposed on end surfaces of the inner glass layer 80. There is no coil conductor or lead-out electrode on the insulator layer 70. In FIG. 2, via-hole conductors for connecting the layers of the inner glass layer are indicated by dash-dot-dot lines.

The lead-out electrode 60a is coupled to the first outer electrode 200a illustrated in FIG. 1. The lead-out electrode 60b is coupled to the second outer electrode 200b illustrated in FIG. 1. The lead-out electrode 60d is coupled to the fourth outer electrode 200d illustrated in FIG. 1. The lead-out electrode 60e is coupled to the fifth outer electrode 200e illustrated in FIG. 1. The lead-out electrode 65a is coupled to the first outer electrode 200a illustrated in FIG. 1. The lead-out electrode 65c is coupled to the third outer electrode 200c illustrated in FIG. 1. The lead-out electrode 65d is coupled to the fourth outer electrode 200d illustrated in FIG. 1. The lead-out electrode 65f is coupled to the sixth outer electrode 200f illustrated in FIG. 1. Lead-out electrodes that are exposed on end surfaces of the inner glass layer 80 and are coupled to the outer electrodes are not formed on the primary coil conductor layer 10, the secondary coil conductor layer 20, the tertiary coil conductor layer 30, or the parallel primary coil conductor layer 40 of the inner glass layer 80.

The primary coil conductor layer 10 includes a primary coil conductor 13 having a coil pattern on the surface of an insulating layer 11. One end portion of the primary coil conductor 13 is an outer end portion 13a of the coil pattern, and the other end portion is an inner end portion 13d of the coil pattern. The secondary coil conductor layer 20 includes a secondary coil conductor 23 having a coil pattern on the surface of an insulating layer 21. One end portion of the secondary coil conductor 23 is an outer end portion 23b of the coil pattern, and the other end portion is an inner end portion 23e of the coil pattern. The tertiary coil conductor layer 30 includes a tertiary coil conductor 33 having a coil pattern on the surface of an insulating layer 31. One end portion of the tertiary coil conductor 33 is an outer end portion 33c of the coil pattern, and the other end portion is an inner end portion 33f of the coil pattern. The parallel primary coil conductor layer 40 includes a parallel primary coil conductor 43 having a coil pattern on the surface of the insulating layer 41. One end portion of the parallel primary coil conductor 43 is an outer end portion 43a of the coil pattern, and the other end portion is an inner end portion 43d of the coil pattern.

As illustrated in FIG. 3, the primary coil conductor 13 of the primary coil conductor layer 10 is coupled to the bottom lead-out electrode layer 60 through a first via-hole conductor 15. More specifically, the inner end portion 13d of the primary coil conductor 13 in the primary coil conductor layer 10 is coupled to the lead-out electrode 60d in the bottom lead-out electrode layer 60 through the first via-hole conductor 15 disposed inside the coil pattern. As illustrated in FIG. 2, the outer end portion 13a of the primary coil conductor 13 is coupled to the lead-out electrode 60a in the bottom lead-out electrode layer 60 through a via-hole conductor 16.

The secondary coil conductor 23 of the secondary coil conductor layer 20 is coupled to the bottom lead-out electrode layer 60 through a second via-hole conductor 25. More specifically, the inner end portion 23e of the secondary coil conductor 23 in the secondary coil conductor layer 20 is coupled to the lead-out electrode 60e in the bottom lead-out electrode layer 60 through the second via-hole conductor 25 disposed inside the coil pattern. As illustrated in FIG. 2, the outer end portion 23b of the secondary coil conductor 23 is coupled to the lead-out electrode 60b in the bottom lead-out electrode layer 60 through a via-hole conductor 26.

The tertiary coil conductor 33 of the tertiary coil conductor layer 30 is coupled to the top lead-out electrode layer 65 through a third via-hole conductor 35. More specifically, the inner end portion 33f of the tertiary coil conductor 33 in the tertiary coil conductor layer 30 is coupled to the lead-out electrode 65f in the top lead-out electrode layer 65 through the third via-hole conductor 35 disposed inside the coil pattern. As illustrated in FIG. 2, the outer end portion 33c of the tertiary coil conductor 33 is coupled to the lead-out electrode 65c in the top lead-out electrode layer 65 through a via-hole conductor 36.

The parallel primary coil conductor 43 of the parallel primary coil conductor layer 40 is coupled to the top lead-out electrode layer 65 through a fourth via-hole conductor 45. More specifically, the inner end portion 43d of the parallel primary coil conductor 43 in the parallel primary coil conductor layer 40 is coupled to the lead-out electrode 65d in the top lead-out electrode layer 65 through the fourth via-hole conductor 45 disposed inside the coil pattern. As illustrated in FIG. 2, the outer end portion 43a of the parallel primary coil conductor 43 is coupled to the lead-out electrode 65a in the top lead-out electrode layer 65 through a via-hole conductor 46.

As illustrated in FIGS. 2 and 3, in a top view of the inner glass layer 80, the first via-hole conductor 15 overlaps the third via-hole conductor 35, and the second via-hole conductor 25 overlaps the fourth via-hole conductor 45. Thus, in all the coil conductor layers of the inner glass layer 80, the number of via-hole conductors inside each coil pattern is two or less. Although in the inner glass layer 80 illustrated in FIGS. 2 and 3 the first via-hole conductor 15 completely overlaps the third via-hole conductor 35 and the second via-hole conductor 25 completely overlaps the fourth via-hole conductor 45 in the top view of the inner glass layer 80, the first via-hole conductor 15 may at least partly overlap the third via-hole conductor 35 and the second via-hole conductor 25 may at least partly overlap the fourth via-hole conductor 45 in the top view of the inner glass layer 80.

In the electronic component according to the first embodiment of the present disclosure, in all the coil conductor layers of the inner glass layer, the number of via-hole conductors inside each coil pattern is two or less, and the area inside the coil pattern can have uses other than a third via-hole conductor. Examples of the uses other than the third via-hole conductor include an increase in the number of turns of the coil pattern and the formation of an inner magnetic path. An increase in the number of turns of the coil pattern and the formation of an inner magnetic path can improve the impedance characteristics of the electronic component.

In the electronic component according to the first embodiment of the present disclosure, the multilayer body may have any external dimensions, preferably approximately 0.80 to 1.00 mm in length, approximately 0.58 to 0.78 mm in width, and approximately 0.25 to 0.45 mm in height. The multilayer body may have rounded corners and edges. The external dimensions of the multilayer body with rounded corners and edges are assumed to be identical with the external dimensions of the multilayer body with sharp corners and edges.

In the electronic component according to the first embodiment of the present disclosure, in addition to the bottom lead-out electrode layer, the primary coil conductor layer, the secondary coil conductor layer, the tertiary coil conductor layer, the parallel primary coil conductor layer, and the top lead-out electrode layer, the inner glass layer may include a lead-out electrode layer, through which an electric current flows from each coil conductor layer, between the primary coil conductor layer and the secondary coil conductor layer, between the secondary coil conductor layer and the tertiary coil conductor layer, and between the tertiary coil conductor layer and the parallel primary coil conductor layer. However, a lead-out electrode layer between the coil conductor layers changes the distance between the coil conductors and consequently changes the characteristic impedance, thus making it difficult to match the characteristic impedance between the primary coil conductor layer, the secondary coil conductor layer, the tertiary coil conductor layer, and the parallel primary coil conductor layer. Thus, in a multilayer body of an electronic component according to a preferred embodiment of the present disclosure, preferably, no lead-out electrode layer is disposed between the primary coil conductor layer, the secondary coil conductor layer, the tertiary coil conductor layer, and the parallel primary coil conductor layer.

In the electronic component according to the first embodiment of the present disclosure, the material of the insulating layers of the inner glass layer and the outer glass layers is a dielectric glass material. The dielectric glass material is composed of a glass material containing at least K, B, and Si and filler components quartz ($SiO_2$) and alumina ($Al_2O_3$). The glass material is preferably borosilicate glass. The borosilicate glass has a composition of $SiO_2$: approximately 70% to 85% by weight, $B_2O_3$: approximately 10% to 25% by weight, $K_2O$: approximately 0.5% to 5% by weight, and $Al_2O_3$: approximately 0% to 5% by weight, for example. The borosilicate glass with such a composition has a low relative permittivity and can therefore improve the high-frequency characteristics of the electronic component.

In the electronic component according to the first embodiment of the present disclosure, in addition to the glass material, quartz, and alumina, the insulating layers of the inner glass layer and the outer glass layers may contain a magnetic material, such as a ferrite material, and a filler component forsterite ($2MgO \cdot SiO_2$). In particular, the insulating layers of the inner glass layer preferably contain, based on the total weight of the insulating layers, approximately 34% to 37% by weight quartz and approximately 0.5% to 4% by weight alumina as filler components. Quartz has a lower relative permittivity than borosilicate glass and can therefore further improve the high-frequency characteristics of the electronic component. Forsterite and alumina have a high bending strength and can improve the mechanical strength of the electronic component. Examples of the ferrite material include Ni—Zn—Cu ferrites. Ferrite has high relative permeability and tends to improve impedance characteristics.

In the electronic component according to the first embodiment of the present disclosure, the quartz content of each outer glass layer is not particularly limited but is preferably lower than the quartz content of each insulating layer of the inner glass layer. The quartz content of each outer glass layer lower than the quartz content of each insulating layer of the inner glass layer results in a higher compressive stress on the outer glass layers and an increased bending strength.

In the electronic component according to the first embodiment of the present disclosure, the difference between the quartz content of each outer glass layer and the quartz content of each insulating layer of the inner glass layer preferably ranges from approximately 3% to 6% by weight. When the difference between the quartz content of each outer glass layer and the quartz content of each insulating layer of the inner glass layer ranges from approximately 3% to 6% by weight, the bending strength can be sufficiently increased. A difference in quartz content of less than approximately 3% by weight may result in a small compressive stress on the outer glass layers and an insufficiently increased bending strength. On the other hand, a difference in quartz content of more than approximately 6% by weight may result in a larger difference in thermal expansion coefficient between the inner glass layer, the magnetic material layers, and the outer glass layers and more cracks in the inner glass layer.

In the electronic component according to the first embodiment of the present disclosure, each outer glass layer may have any thickness and preferably has a thickness in the range of approximately 15 to 45 µm. When each outer glass layer has a thickness of less than approximately 15 µm, stress resulting from the difference in thermal expansion coefficient between the magnetic material layers and the inner glass layer cannot be sufficiently relieved by the outer glass layers, thus causing more cracks in the inner glass layer. On the other hand, when each outer glass layer has a thickness of more than approximately 45 µm, the outer glass layers may not be subjected to sufficient compressive stress and may be easily detached.

In the electronic component according to the first embodiment of the present disclosure, the coil conductor of each coil conductor layer includes a coil pattern, an outer end portion disposed outside the coil pattern, and an inner end portion disposed inside the coil pattern. The coil conductor can be formed by applying an electrically conductive paste to the insulating layer, for example, by printing. The material of the coil conductor is, but not limited to, Ag, for example.

In the electronic component according to the first embodiment of the present disclosure, the number of turns of each coil conductor depends on the desired frequency characteristics and is preferably, but not limited to, 6 or more.

In the electronic component according to the first embodiment of the present disclosure, each coil conductor may have any length (conductor line length of the coil pattern portion) and preferably has almost the same length.

In the electronic component according to the first embodiment of the present disclosure, although the cross-sectional area of each coil conductor (the product of linewidth and thickness of the coil conductor pattern) is not particularly limited, to make the series resistance of each coil conductor layer uniform, it is desirable that the secondary coil conductor and the tertiary coil conductor have almost the same cross-sectional area, and the primary coil conductor and the parallel primary coil conductor have a cross-sectional area approximately 0.5 times the cross-sectional area of the secondary coil conductor and the tertiary coil conductor. When the primary coil conductor and the parallel primary coil conductor have a cross-sectional area approximately 0.5 times the cross-sectional area of the secondary coil conductor and the tertiary coil conductor, the series resistance between the first outer electrode and the fourth outer electrode, the series resistance between the second outer electrode and the fifth outer electrode, and the series resistance between the third outer electrode and the sixth outer electrode can be adjusted to be almost the same.

In the electronic component according to the first embodiment of the present disclosure, the pitch (the sum of the linewidth of the coil conductor pattern and the distance to an adjacent coil conductor pattern) of the coil pattern of each coil conductor is not particularly limited and preferably ranges from approximately 28 to 34 μm.

In the electronic component according to the first embodiment of the present disclosure, each coil conductor preferably has a cross-sectional area in the range of approximately 30 to 160 μm$^2$. When each coil conductor has a cross-sectional area of less than approximately 30 μm$^2$, it is difficult to form the coil conductor layer by screen printing, and conductor line failure (disconnection) is likely to occur. On the other hand, when each coil conductor has a cross-sectional area of more than approximately 160 μm$^2$, the number of turns of the coil pattern must be decreased to prevent coil patterns from too closely approaching each other, and desired impedance characteristics may not be achieved.

In the electronic component according to the first embodiment of the present disclosure, the bottom lead-out electrode layer and the top lead-out electrode layer have a lead-out electrode on a surface of an insulating layer. The material of the lead-out electrode is, but not limited to, Ag, for example. The material of the insulating layer may be a nonmagnetic material, such as a glass material.

In the electronic component according to the first embodiment of the present disclosure, the primary coil conductor layer and the bottom lead-out electrode layer, the secondary coil conductor layer and the bottom lead-out electrode layer, the tertiary coil conductor layer and the top lead-out electrode layer, and the parallel primary coil conductor layer and the top lead-out electrode layer are coupled to each other through a via-hole conductor. The material of the via-hole conductor is, but not limited to, Ag, for example.

In the electronic component according to the first embodiment of the present disclosure, the material of the outer electrodes is, but not limited to, Ni or Sn, for example. An underlying electrode may be disposed inside the Ni or Sn electrode layer. The underlying electrode is formed by applying an electrically conductive paste containing a Ag powder and a glass frit to the surface of the multilayer body and firing the paste. The outer electrode is formed by forming a Ni film or a Sn film on the surface of the underlying electrode by plating.

In the electronic component according to the first embodiment of the present disclosure, each of the primary coil conductor layer, the secondary coil conductor layer, the tertiary coil conductor layer, and the parallel primary coil conductor layer may include two or more coil conductors. When one coil conductor layer includes two or more coil conductors, each coil conductor preferably has coil patterns that almost overlap in a top view of the multilayer body. Each coil conductor is connected in parallel. When the number of secondary coil conductors of the secondary coil conductor layer is two, the number of tertiary coil conductors of the tertiary coil conductor layer is two, and each coil conductor has the same cross-sectional area, the total series resistance of the secondary coil conductor layer and the tertiary coil conductor layer is almost the same as the total series resistance of the primary coil conductor and the parallel primary coil conductor. In this case, the series resistance between the first and fourth outer electrodes coupled to the primary coil conductor layer and the parallel primary coil conductor layer, the series resistance between the second and fifth outer electrodes coupled to the secondary coil conductor layer having two secondary coil conductors, and the series resistance between the third and sixth outer electrodes coupled to the tertiary coil conductor layer having two tertiary coil conductors are almost the same. Thus, as described above, even if the first outer electrode and the fourth outer electrode are not disposed between the second outer electrode and the third outer electrode or between the fifth outer electrode and the sixth outer electrode, the electronic component can be used without distinction of left and right.

Figure 4:
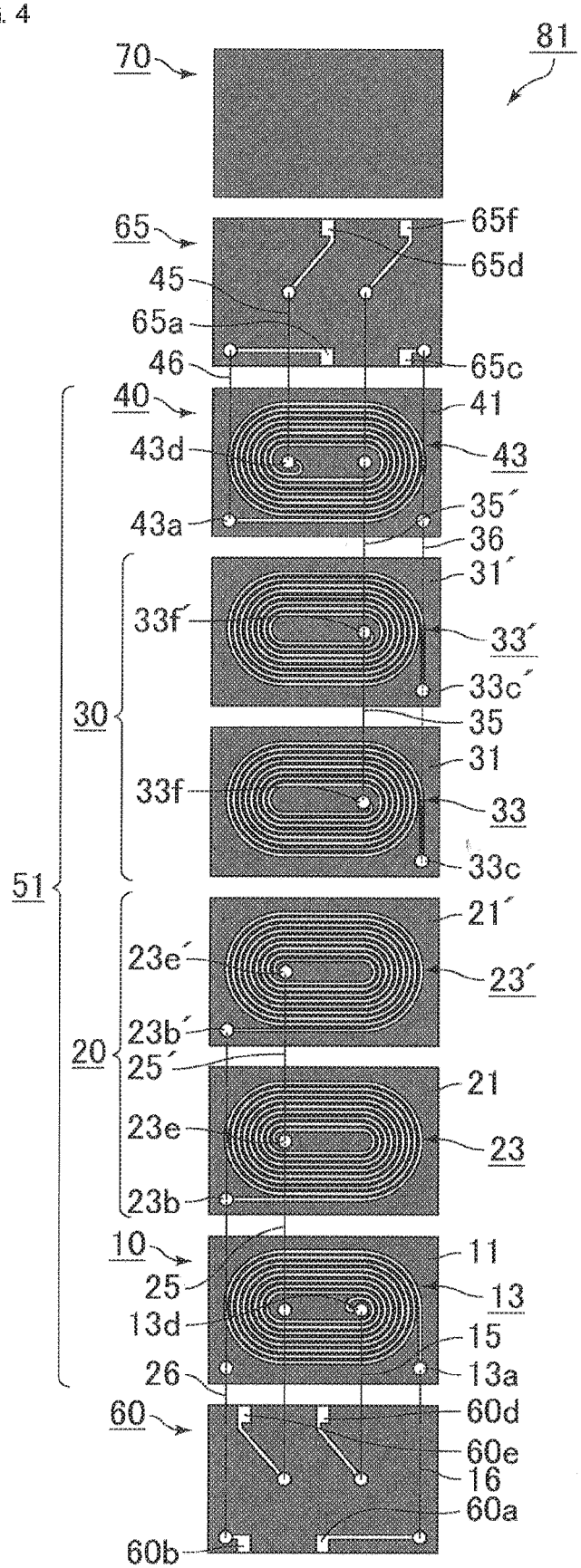
FIG. 4 is a schematic explanatory view of each layer of another example of the inner glass layer of the electronic component according to the first embodiment of the present disclosure.
Figure 5:
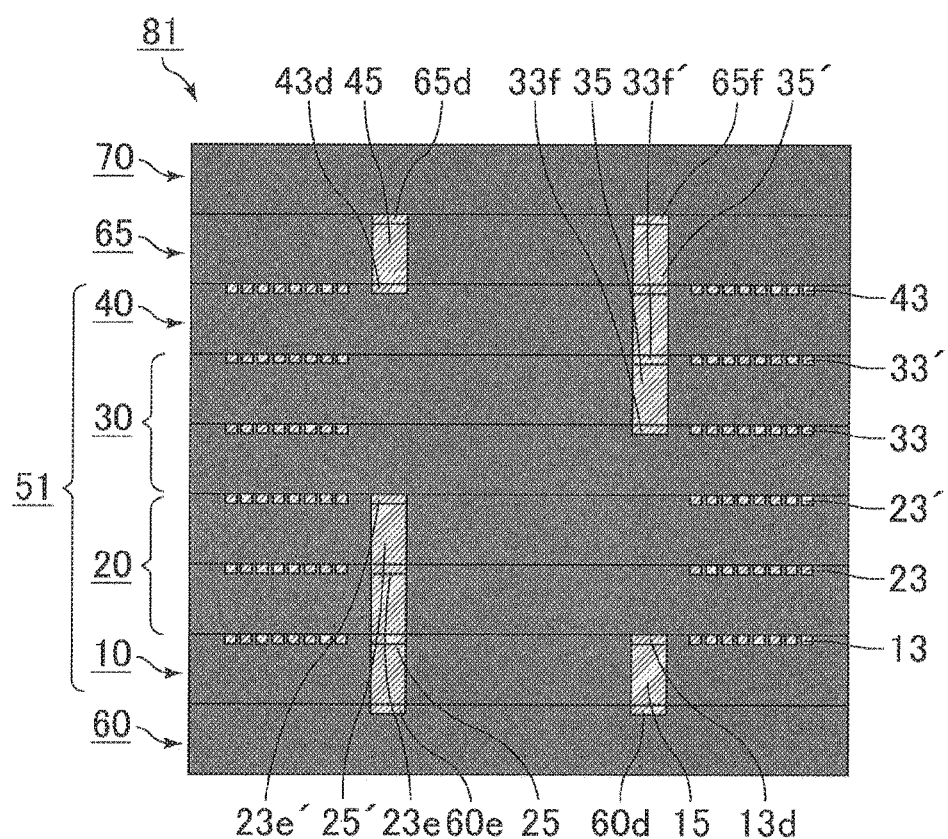
FIG. 5 is a schematic cross-sectional view of the inner glass layer illustrated in FIG. 4 taken along the line corresponding to the line A-A of FIG. 1.

A coil conductor layer including a plurality of coil conductors is described below with reference to FIGS. 4 and 5. FIG. 4 is a schematic explanatory view of each layer of another example of the inner glass layer of the electronic component according to the first embodiment of the present disclosure. FIG. 5 is a schematic cross-sectional view of the inner glass layer illustrated in FIG. 4 taken along the line corresponding to the line A-A of FIG. 1. As illustrated in FIGS. 4 and 5, an inner glass layer 81 includes a bottom lead-out electrode layer 60, a primary coil conductor layer 10, a secondary coil conductor layer 20, a tertiary coil conductor layer 30, a parallel primary coil conductor layer 40, a top lead-out electrode layer 65, and an insulator layer 70 stacked in this order on the bottom surface thereof. The secondary coil conductor layer 20 includes two secondary coil conductors (23, 23'), and the tertiary coil conductor layer 30 includes two tertiary coil conductors (33, 33'). The two secondary coil conductors 23 and 23' are formed on the surface of the insulating layers 21 and 21', respectively. The two tertiary coil conductors 33 and 33' are formed on the surface of the insulating layers 31 and 31', respectively. Connections between the coil conductors other than the secondary coil conductor 23' and the tertiary coil conductor 33', the via-hole conductors, and the lead-out electrodes are the same as in the inner glass layer 80 illustrated in FIGS. 1 to 3.

In the secondary coil conductor layer 20, the secondary coil conductor 23 overlaps the secondary coil conductor 23' in a top view of the inner glass layer 81. The secondary coil conductor 23' includes an outer end portion 23b' of the coil pattern and an inner end portion 23e' of the coil pattern, and the outer end portion 23b' and the inner end portion 23e' almost overlap the outer end portion 23b and the inner end portion 23e of the secondary coil conductor 23 in the top view of the multilayer body. Thus, the secondary coil conductors 23 and 23' are coupled to the bottom lead-out electrode layer 60 through second via-hole conductors 25 and 25' and a via-hole conductor 26.

In the tertiary coil conductor layer 30, the tertiary coil conductor 33 overlaps the tertiary coil conductor 33' in the top view of the inner glass layer 81. The tertiary coil conductor 33' includes an outer end portion 33c' of the coil pattern and an inner end portion 33f' of the coil pattern, and the outer end portion 33c' and the inner end portion 33f' almost overlap the outer end portion 33c and the inner end portion 33f of the tertiary coil conductor 33 in the top view of the multilayer body. Thus, the tertiary coil conductors 33 and 33' are coupled to the top lead-out electrode layer 65 through third via-hole conductors 35 and 35' and a via-hole conductor 36.

The inner glass layer 81 includes a primary coil conductor 13, the secondary coil conductor 23, the secondary coil conductor 23', the tertiary coil conductor 33, the tertiary coil conductor 33', and a parallel primary coil conductor 43 stacked in this order on the bottom surface thereof. The primary coil conductor 13 is connected in parallel to the parallel primary coil conductor 43, the secondary coil conductor 23 is connected in parallel to the secondary coil conductor 23', and the tertiary coil conductor 33 is connected in parallel to the tertiary coil conductor 33'. In such a structure, the characteristic impedance can be matched between the primary coil conductor layer 10, the parallel primary coil conductor layer 40, and the secondary coil conductor layer 20, between the secondary coil conductor layer 20 and the tertiary coil conductor layer 30, and between the tertiary coil conductor layer 30, the primary coil conductor layer 10, and the parallel primary coil conductor layer 40. Almost the same (matched) characteristic impedance between the coil conductor layers results in less energy loss of the electronic component.

In the electronic component according to the first embodiment of the present disclosure, an inner magnetic path passing through the primary coil conductor layer, the secondary coil conductor layer, the tertiary coil conductor layer, and the parallel primary coil conductor layer may be formed inside the coil patterns of the primary coil conductor layer, the secondary coil conductor layer, the tertiary coil conductor layer, and the parallel primary coil conductor layer. The inner magnetic path does not overlap a first via-hole conductor, the second via-hole conductors, the third via-hole conductors, or a fourth via-hole conductor in the top view of the multilayer body. The inner magnetic path inside the coil patterns enhances the interaction between magnetic fields generated by the coil conductors and improves impedance characteristics.

Figure 6:
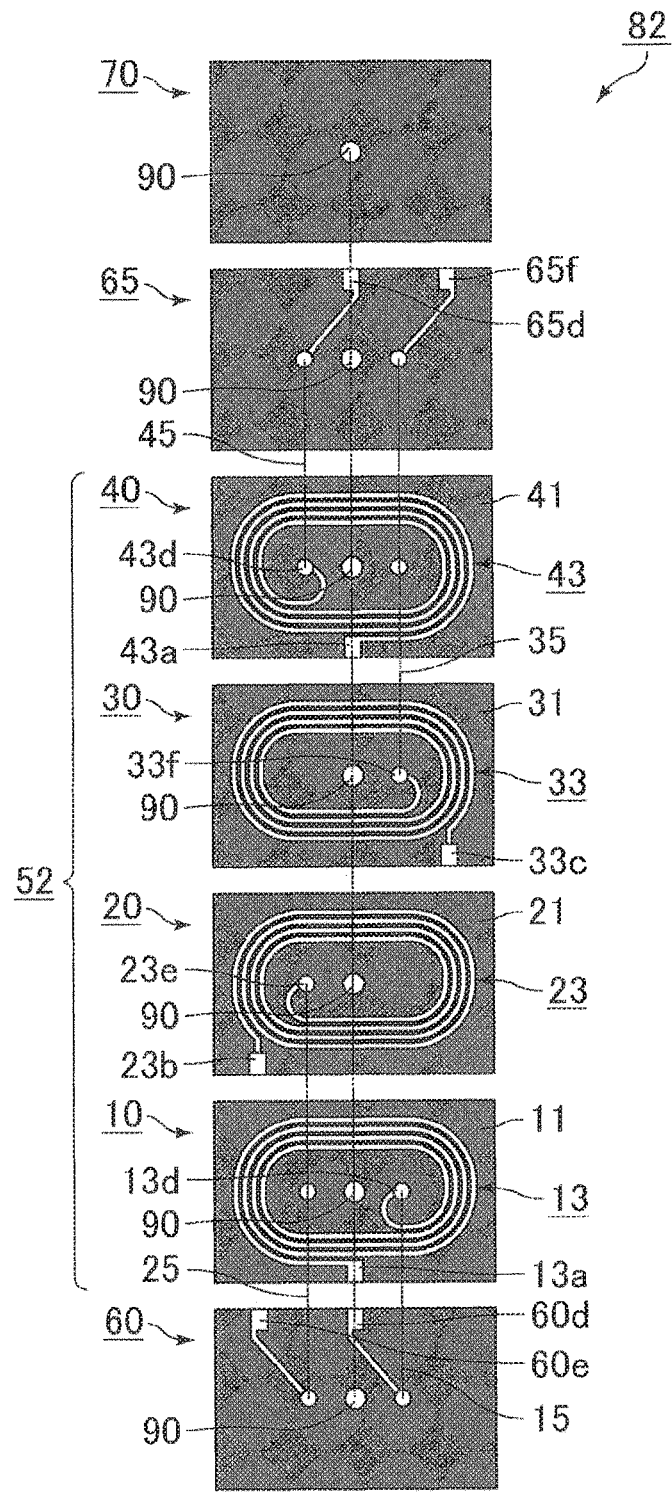
FIG. 6 is a schematic explanatory view of each layer of still another example of the inner glass layer of the electronic component according to the first embodiment of the present disclosure.
Figure 7:
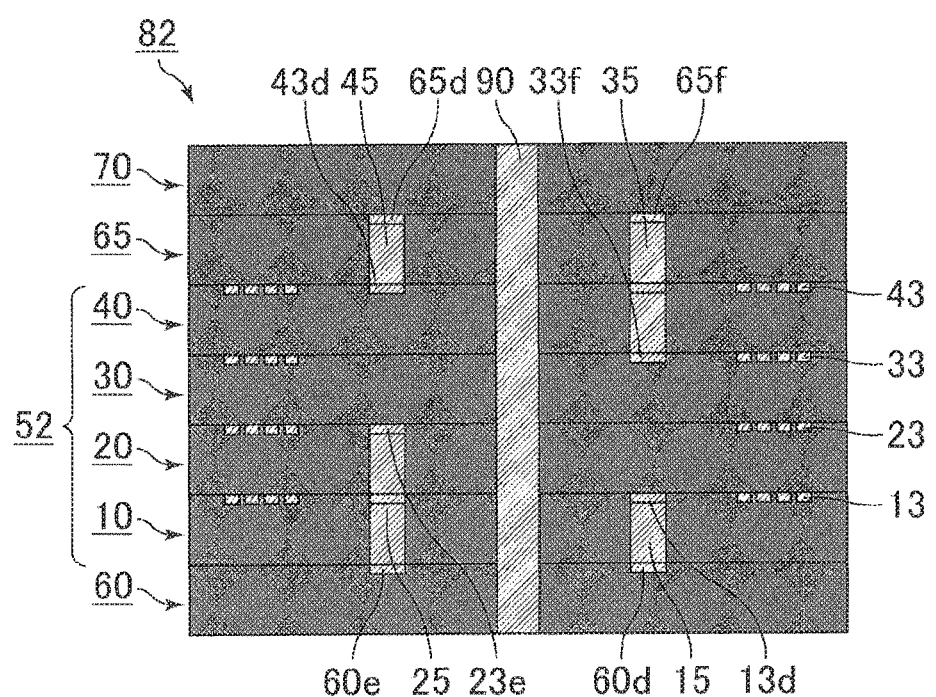
FIG. 7 is a schematic cross-sectional view of the inner glass layer illustrated in FIG. 6 taken along the line corresponding to the line A-A of FIG. 1.

An inner glass layer including an inner magnetic path is described below with reference to FIGS. 6 and 7. FIG. 6 is a schematic explanatory view of each layer of still another example of the inner glass layer of the electronic component according to the first embodiment of the present disclosure. FIG. 7 is a schematic cross-sectional view of the inner glass layer illustrated in FIG. 6 taken along the line corresponding to the line A-A of FIG. 1. As illustrated in FIGS. 6 and 7, an inner glass layer 82 includes a bottom lead-out electrode layer 60, a primary coil conductor layer 10, a secondary coil conductor layer 20, a tertiary coil conductor layer 30, a parallel primary coil conductor layer 40, a top lead-out electrode layer 65, and an insulator layer 70 stacked in this order on the bottom surface thereof. The primary coil conductor layer 10, the secondary coil conductor layer 20, the tertiary coil conductor layer 30, and the parallel primary coil conductor layer 40 are stacked to form a coil multilayer body 52.

As illustrated in FIG. 7, the inner glass layer 82 includes an inner magnetic path 90 inside coil patterns. The inner magnetic path 90 does not overlap a first via-hole conductor 15, a second via-hole conductor 25, a third via-hole conductor 35, or a fourth via-hole conductor 45 in the top view and passes through the bottom lead-out electrode layer 60, the primary coil conductor layer 10, the secondary coil conductor layer 20, the tertiary coil conductor layer 30, the parallel primary coil conductor layer 40, the top lead-out electrode layer 65, and the insulator layer 70. Unlike the inner glass layer 80 illustrated in FIGS. 1 to 3 and the inner glass layer 81 illustrated in FIGS. 4 and 5, the inner glass layer 82 illustrated in FIGS. 6 and 7 has no via-hole conductor outside the coil patterns of the coil conductor layers.

In the primary coil conductor layer 10, an outer end portion 13a of a primary coil conductor 13 is directly exposed on an end surface of the inner glass layer 82, and an inner end portion 13d is coupled to a lead-out electrode 60d of the bottom lead-out electrode layer 60 through a first via-hole conductor 15. In the secondary coil conductor layer 20, an outer end portion 23b of a secondary coil conductor 23 is directly exposed on an end surface of the inner glass layer 82, and an inner end portion 23e is coupled to a lead-out electrode 60e of the bottom lead-out electrode layer 60 through a second via-hole conductor 25. In the tertiary coil conductor layer 30, an outer end portion 33c of a tertiary coil conductor 33 is directly exposed on an end surface of the inner glass layer 82, and an inner end portion 33f is coupled to a lead-out electrode 65f of the top lead-out electrode layer 65 through a third via-hole conductor 35. In the parallel primary coil conductor layer 40, an outer end portion 43a of a parallel primary coil conductor 43 is directly exposed on an end surface of the inner glass layer 82, and an inner end portion 43d is coupled to a lead-out electrode 65d of the top lead-out electrode layer 65 through a fourth via-hole conductor 45.

The material of the inner magnetic path is preferably, but not limited to, a material with high relative permeability. Examples of the material with high relative permeability include ferrites, such as Ni—Zn—Cu ferrites.

Figure 8:
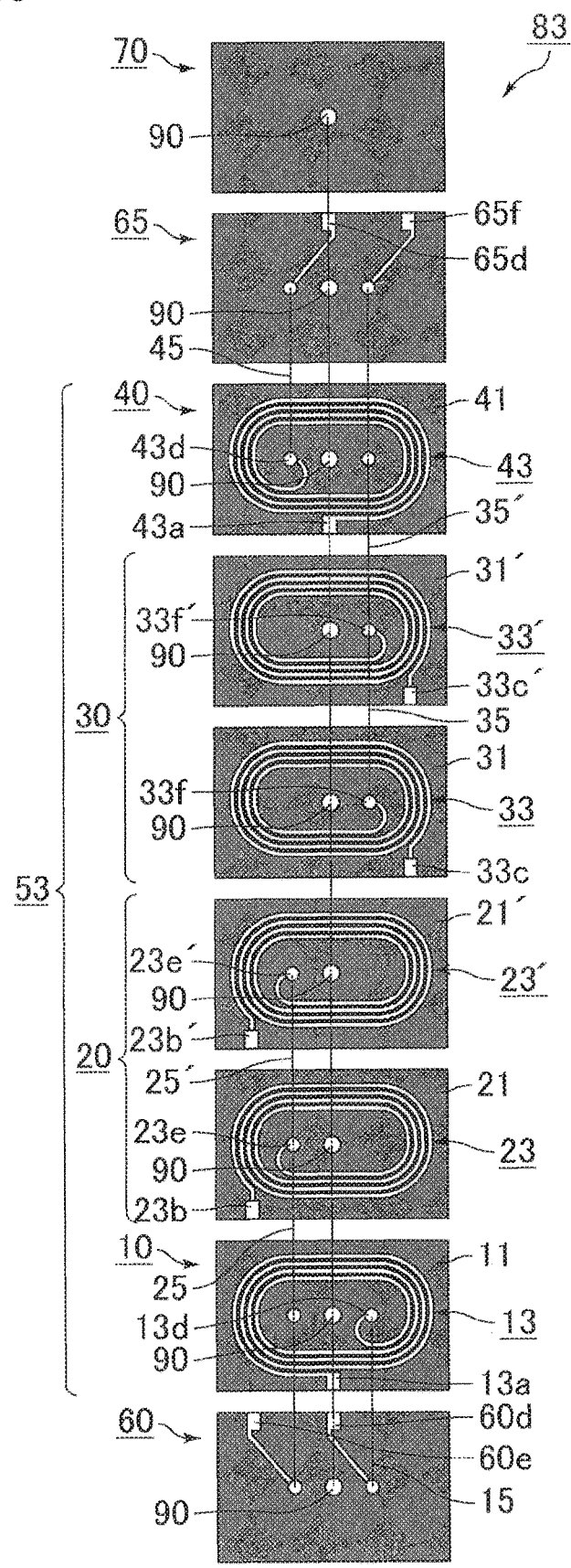
FIG. 8 is a schematic explanatory view of each layer of still another example of the inner glass layer of the electronic component according to the first embodiment of the present disclosure.
Figure 9:
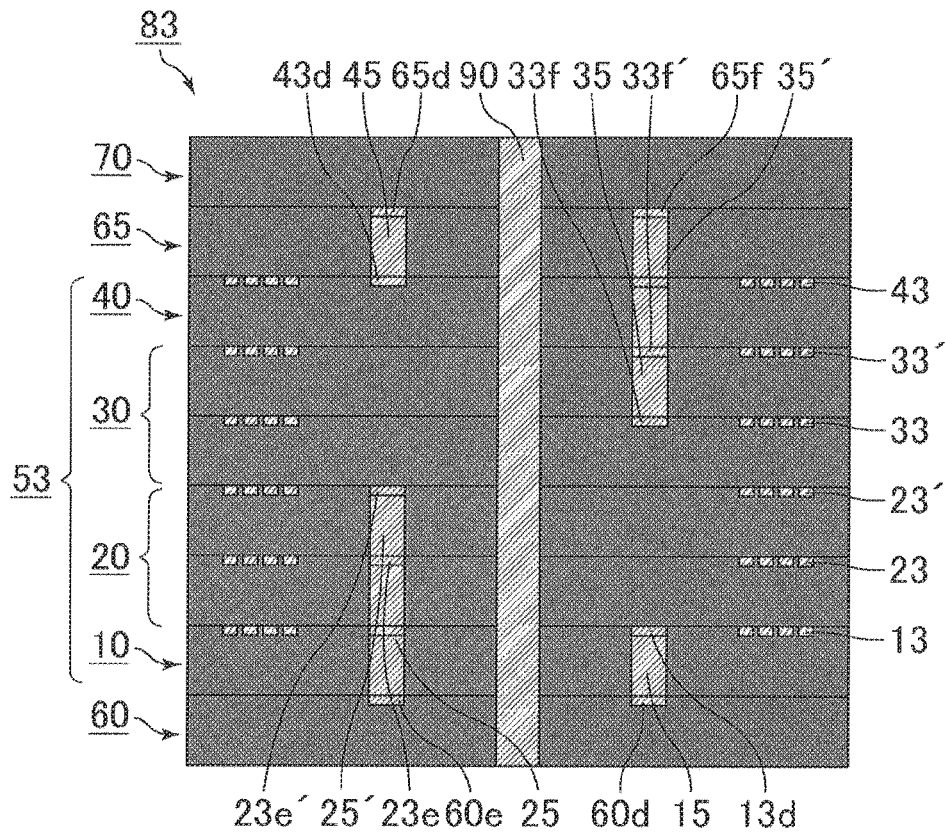
FIG. 9 is a schematic cross-sectional view of the inner glass layer illustrated in FIG. 8 taken along the line corresponding to the line A-A of FIG. 1.

Still another embodiment of the electronic component according to the first embodiment of the present disclosure is described below with reference to FIGS. 8 and 9. FIG. 8 is a schematic explanatory view of each layer of another example of the inner glass layer of the electronic component according to the first embodiment of the present disclosure. FIG. 9 is a schematic cross-sectional view of the inner glass layer illustrated in FIG. 8 taken along the line corresponding to the line A-A of FIG. 1. As illustrated in FIGS. 8 and 9, an inner glass layer 83 includes a bottom lead-out electrode layer 60, a primary coil conductor layer 10, a secondary coil conductor layer 20, a tertiary coil conductor layer 30, a parallel primary coil conductor layer 40, a top lead-out electrode layer 65, and an insulator layer 70 stacked in this order on the bottom surface thereof.

As illustrated in FIG. 9, the inner glass layer 83 includes an inner magnetic path 90 inside coil patterns. The inner magnetic path 90 does not overlap a first via-hole conductor 15, second via-hole conductors 25 and 25', third via-hole conductor 35 and 35', or a fourth via-hole conductor 45 in a top view of the inner glass layer 83 and passes through the bottom lead-out electrode layer 60, the primary coil conductor layer 10, the secondary coil conductor layer 20, the tertiary coil conductor layer 30, the parallel primary coil conductor layer 40, the top lead-out electrode layer 65, and the insulator layer 70.

Outer end portions 23b and 23b' of coil patterns of secondary coil conductors 23 and 23' in the secondary coil conductor layer 20 are directly exposed on an end surface of the inner glass layer 83 and are coupled to a second outer electrode 200b. Outer end portions 33c and 33c' of coil patterns of the tertiary coil conductors 33 and 33' in the tertiary coil conductor layer 30 are directly exposed on an end surface of the inner glass layer 83 and are coupled to a third outer electrode 200c. Connections between the other via-hole conductors, coil conductors, and lead-out electrodes are the same as in the inner glass layer 82 illustrated in FIGS. 6 and 7.

In the electronic component according to the first embodiment of the present disclosure, when the inner glass layer includes an inner magnetic path, the inner magnetic path, the bottom magnetic material layer, and the top magnetic material layer may be formed of the same material. In this case, the region in which the inner magnetic path is to be formed may be an empty space (through-hole) in the preparation of the multilayer body, and after the multilayer body is prepared a magnetic material paste serving as a raw material for the magnetic material layers may be charged in the empty space (through-hole) to simultaneously form the inner magnetic path and the magnetic material layers. When an insulator layer is formed on the top surface of the top lead-out electrode layer, the top magnetic material layer is preferably formed on the top surface of the insulator layer. When an insulator layer is formed on the bottom of the bottom lead-out electrode layer, the bottom magnetic material layer is preferably formed on the bottom surface of the insulator layer.

Second Embodiment

An electronic component according to a second embodiment of the present disclosure is an electronic component that includes an outer electrode on a surface of a multilayer body including an inner glass layer, a magnetic material layer on a top surface and a bottom surface of the inner glass layer, and an outer glass layer on a top surface and a bottom surface of the magnetic material layer. The inner glass layer includes a coil multilayer body and a lead-out electrode layer on a top surface and/or a bottom surface of the coil multilayer body. The coil multilayer body includes a plurality of coil conductor layers. Each of the coil conductor layers includes a coil conductor having a coil pattern on a surface of an insulating layer, the lead-out electrode layer including a lead-out electrode on a surface of an insulating layer. The coil multilayer body includes a primary coil conductor layer including a primary coil conductor and a secondary coil conductor layer including a secondary coil conductor stacked in this order on the bottom surface thereof. The outer electrode includes a first outer electrode, a second outer electrode, a third outer electrode, and a fourth outer electrode. The primary coil conductor is coupled to the first outer electrode and the third outer electrode. The secondary coil conductor is coupled to the second outer electrode and the fourth outer electrode. The insulating layers of the inner glass layer and the outer glass layers contain a dielectric glass material that contains a glass material containing at least K, B, and Si, quartz, and alumina. The glass material content of each insulating layer of the inner glass layer ranges from approximately 60% to 65% by weight. The quartz content of each insulating layer of the inner glass layer ranges from approximately 34% to 37% by weight, and the alumina content of each insulating layer of the inner glass layer ranges from approximately 0.5% to 4% by weight.

In the electronic component according to the second embodiment of the present disclosure, the quartz content of each insulating layer of the inner glass layer ranges from approximately 34% to 37% by weight, which is higher than the quartz content in known electronic components. Thus, the inner glass layer has a thermal expansion coefficient (CTE) closer to the thermal expansion coefficient of the magnetic material layers. This can decrease tensile stress on the inner glass layer and decrease cracks caused by contact with a plating solution. If the quartz content of each insulating layer of the inner glass layer is less than approximately 34% by weight, this increases the difference in thermal expansion coefficient from the magnetic material layers and tends to increase cracks. On the other hand, if the quartz content of each insulating layer of the inner glass layer is more than approximately 37% by weight, the inner glass layer has lower sinterability and mechanical strength. In the electronic component according to the second embodiment of the present disclosure, the alumina content of each insulating layer of the inner glass layer ranges from approximately 0.5% to 4% by weight. Thus, a cristobalite phase can be formed in the inner glass layer and can further decrease cracks caused by contact with a plating solution. If the alumina content of each insulating layer of the inner glass layer is less than approximately 0.5% by weight, the inner glass layer is over-sintered, and bubbles are easily formed. On the other hand, if the alumina content of each insulating layer of the inner glass layer is more than 4% by weight, this lowers the sinterability of the glass, a larger difference in thermal expansion coefficient from the magnetic material layers, and more cracks.

The outer electrodes of the electronic component according to the second embodiment of the present disclosure are described below. The electronic component according to the second embodiment of the present disclosure includes the first outer electrode, the second outer electrode, the third outer electrode, and the fourth outer electrode (hereinafter also collectively referred to as first to fourth outer electrodes) on the surface of the multilayer body. Although the first to fourth outer electrodes may be located at any position on the surface of the multilayer body, considering that the primary coil conductor is coupled to the first outer electrode and the third outer electrode, and the secondary coil conductor is coupled to the second outer electrode and the fourth outer electrode, preferably, the first outer electrode faces the third outer electrode, and the second outer electrode faces the fourth outer electrode.

Figure 10:
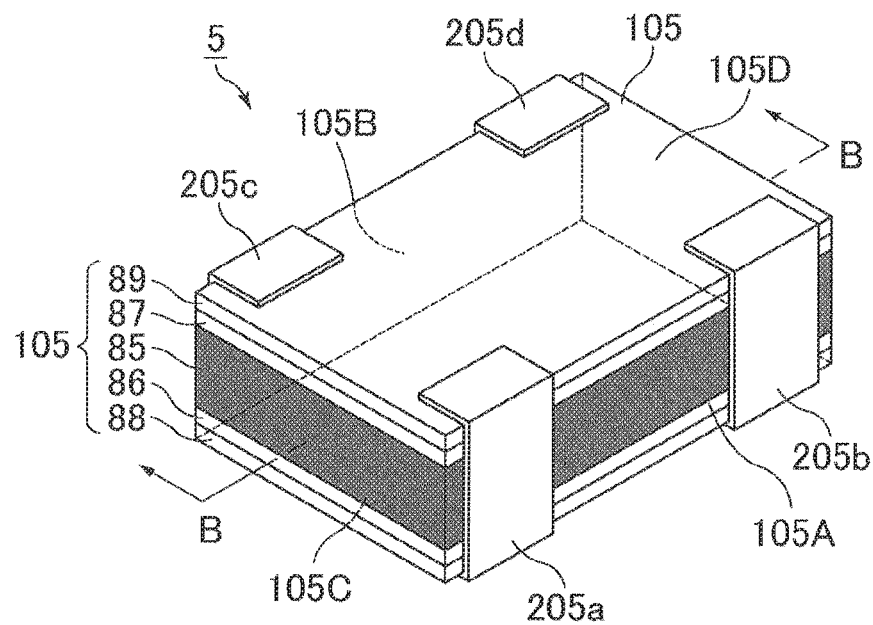
FIG. 10 is a schematic perspective view of an electronic component according to a second embodiment of the present disclosure.

The outer electrodes of the electronic component according to the second embodiment of the present disclosure are described below with reference to FIG. 10. FIG. 10 is a schematic perspective view of an example of the electronic component according to the second embodiment of the present disclosure. As illustrated in FIG. 10, an electronic component 5 includes a first outer electrode 205a, a second outer electrode 205b, a third outer electrode 205c, and a fourth outer electrode 205d on end surfaces of a multilayer body 105. The first outer electrode 205a and the second outer electrode 205b are disposed on a first end surface 105A, and the third outer electrode 205c and the fourth outer electrode 205d are disposed on a second end surface 105B facing the first end surface 105A. Although the first to fourth outer electrodes 205a to 205d are partly formed on a bottom surface 105C and a top surface 105D of the multilayer body 105 in the electronic component 5 illustrated in FIG. 10, no outer electrode may be formed on the bottom surface 105C or the top surface 105D of the multilayer body 105. The multilayer body 105 includes an inner glass layer 85, magnetic material layers (87, 86) on the top surface and the bottom surface of the inner glass layer 85, and outer glass layers (89, 88) on the top surface and the bottom surface of the magnetic material layers. More specifically, the multilayer body 105 includes the inner glass layer 85, the top magnetic material layer 87 on the top surface of the inner glass layer 85, the top outer glass layer 89 on the top surface of the top magnetic material layer 87, the bottom magnetic material layer 86 on the bottom surface of the inner glass layer 85, and the bottom outer glass layer 88 on the bottom surface of the bottom magnetic material layer 86.

The inner glass layer of the electronic component according to the second embodiment of the present disclosure is described below. The inner glass layer includes a coil multilayer body and a top lead-out electrode layer on a top surface of the coil multilayer body and/or a bottom lead-out electrode layer on a bottom surface of the coil multilayer body, the coil multilayer body including a plurality of coil conductor layers, each of the coil conductor layers including a coil conductor having a coil pattern on a surface of an insulating layer, the top lead-out electrode layer including a lead-out electrode on a surface of an insulating layer, the bottom lead-out electrode layer including a lead-out electrode on a surface of an insulating layer.

In the electronic component according to the second embodiment of the present disclosure, the coil multilayer body includes a primary coil conductor layer including a primary coil conductor and a secondary coil conductor layer including a secondary coil conductor stacked in this order on the bottom surface thereof.

In the electronic component according to the second embodiment of the present disclosure, the inner glass layer may further include an insulator layer. The insulator layer is preferably formed on the bottom surface of the bottom lead-out electrode layer and/or on the top surface of the secondary coil conductor layer.

Figure 11:
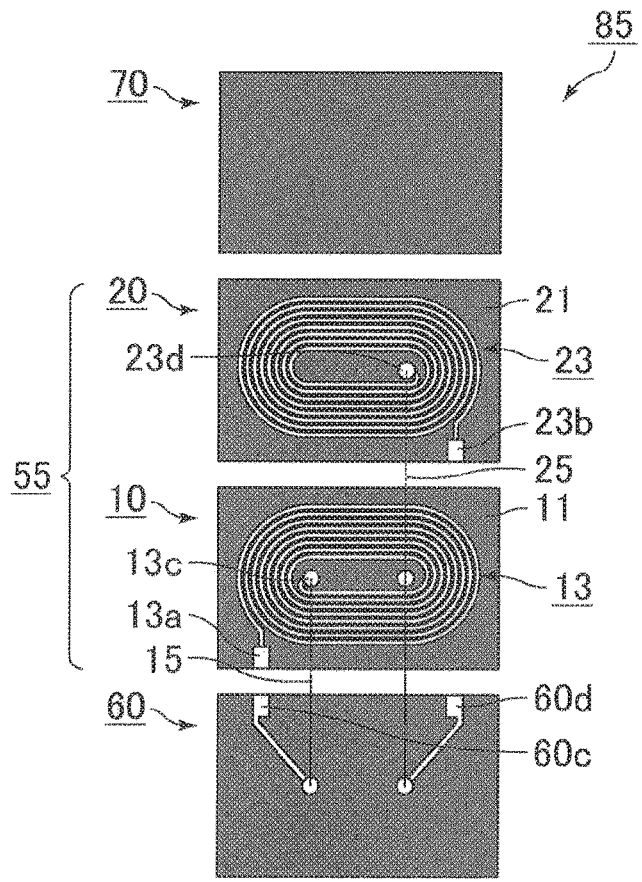
FIG. 11 is a schematic explanatory view of each layer of an example of an inner glass layer of the electronic component according to the second embodiment of the present disclosure.
Figure 12:
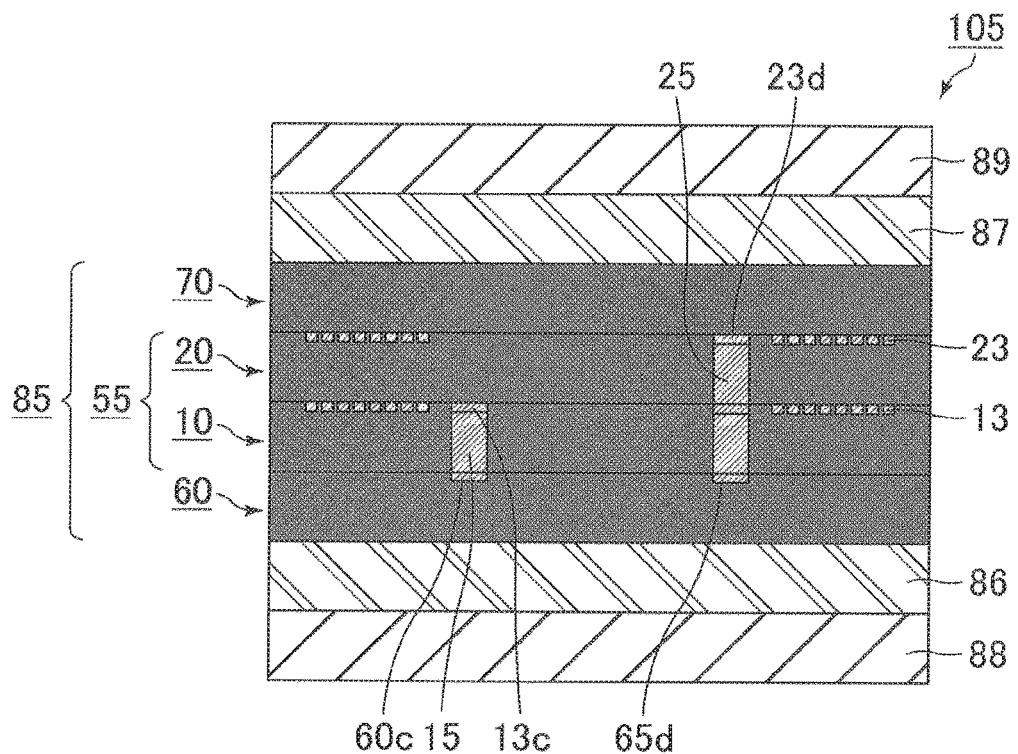
FIG. 12 is a cross-sectional view taken along the line B-B of FIG. 10.

The inner glass layer of the electronic component according to the second embodiment of the present disclosure is described below with reference to FIGS. 11 and 12. FIG. 11 is a schematic explanatory view of each layer of an example of the inner glass layer of the electronic component according to the second embodiment of the present disclosure, and FIG. 12 is a cross-sectional view taken along the line B-B of FIG. 10. As illustrated in FIG. 11, the inner glass layer 85 includes a bottom lead-out electrode layer 60, a primary coil conductor layer 10, a secondary coil conductor layer 20, and an insulator layer 70 stacked in this order on the bottom surface thereof. The primary coil conductor layer 10 and the secondary coil conductor layer 20 are also collectively referred to as a coil multilayer body 55. The bottom lead-out electrode layer 60 includes lead-out electrodes 60c and 60d that are exposed on an end surface of the inner glass layer 85 and are coupled to the outer electrodes. There is no coil conductor or lead-out electrode on the insulator layer 70. In FIG. 11, via-hole conductors 15 and 25 for connecting the layers of the inner glass layer are indicated by dash-dot-dot lines.

The lead-out electrode 60c is coupled to the third outer electrode 205c illustrated in FIG. 10. The lead-out electrode 60d is coupled to the fourth outer electrode 205d illustrated in FIG. 10.

The primary coil conductor layer 10 includes a primary coil conductor 13 having a coil pattern on the surface of an insulating layer 11. One end portion of the primary coil conductor 13 is an outer end portion 13a of the coil pattern, and the other end portion is an inner end portion 13c of the coil pattern. The secondary coil conductor layer 20 includes a secondary coil conductor 23 having a coil pattern on the surface of an insulating layer 21. One end portion of the secondary coil conductor 23 is an outer end portion 23b of the coil pattern, and the other end portion is an inner end portion 23d of the coil pattern.

As illustrated in FIG. 11, the primary coil conductor 13 of the primary coil conductor layer 10 is coupled to the bottom lead-out electrode layer 60 through a first via-hole conductor 15. More specifically, the inner end portion 13c of the primary coil conductor 13 in the primary coil conductor layer 10 is coupled to the lead-out electrode 60c in the bottom lead-out electrode layer 60 through the first via-hole conductor 15 disposed inside the coil pattern. The outer end portion 13a of the primary coil conductor 13 is directly exposed on an end surface of the inner glass layer 85 and is coupled to the outer electrode 205a illustrated in FIG. 10.

The secondary coil conductor 23 of the secondary coil conductor layer 20 is coupled to the bottom lead-out electrode layer 60 through a second via-hole conductor 25. More specifically, the inner end portion 23d of the secondary coil conductor 23 in the secondary coil conductor layer 20 is coupled to the lead-out electrode 60d in the bottom lead-out electrode layer 60 through the second via-hole conductor 25 disposed inside the coil pattern. The outer end portion 23b of the secondary coil conductor 23 is directly exposed on an end surface of the inner glass layer 85 and is coupled to the outer electrode 205b illustrated in FIG. 10.

The electronic component according to the second embodiment of the present disclosure includes the lead-out electrode layer on at least one of the top surface and the bottom surface of the coil multilayer body in the inner glass layer. More specifically, in the electronic component according to the second embodiment of the present disclosure, the inner glass layer may include the top lead-out electrode layer on the top surface of the coil multilayer body, the bottom lead-out electrode layer on the bottom surface of the coil multilayer body, or the top lead-out electrode layer and the bottom lead-out electrode layer on the top surface and the bottom surface of the coil multilayer body.

In the electronic component according to the second embodiment of the present disclosure, the material of the insulating layers of the inner glass layer and the outer glass layers is a dielectric glass material. The dielectric glass material is composed of a glass material containing at least K, B, and Si and filler components quartz ($SiO_2$) and alumina ($Al_2O_3$). The glass material is preferably borosilicate glass. The borosilicate glass has a composition of $SiO_2$: approximately 70% to 85% by weight, $B_2O_3$: approximately 10% to 25% by weight, $K_2O$: approximately 0.5% to 5% by weight, and $Al_2O_3$: approximately 0% to 5% by weight, for example. The borosilicate glass with such a composition has a low relative permittivity and can therefore improve the high-frequency characteristics of the electronic component.

In the electronic component according to the second embodiment of the present disclosure, in addition to the glass material, quartz, and alumina, the insulating layers of the inner glass layer and the outer glass layers may contain a magnetic material, such as a ferrite material, and a filler component forsterite ($2MgO·SiO_2$). In particular, the insulating layers of the inner glass layer preferably contain, based on the total weight of the insulating layers, approximately 34% to 37% by weight quartz and approximately 0.5% to 4% by weight alumina as filler components. Quartz has a lower relative permittivity than borosilicate glass and can therefore further improve the high-frequency characteristics of the electronic component. Forsterite and alumina have a high bending strength and can improve the mechanical strength of the electronic component. Examples of the ferrite material include Ni—Zn—Cu ferrites. Ferrite has high relative permeability and tends to improve impedance characteristics.

In the electronic component according to the second embodiment of the present disclosure, the quartz content of each outer glass layer is not particularly limited but is preferably lower than the quartz content of each insulating layer of the inner glass layer. The quartz content of each outer glass layer lower than the quartz content of each insulating layer of the inner glass layer results in a higher compressive stress on the outer glass layers and an increased bending strength.

In the electronic component according to the second embodiment of the present disclosure, the difference between the quartz content of each outer glass layer and the quartz content of each insulating layer of the inner glass layer preferably ranges from approximately 3% to 6% by weight. When the difference between the quartz content of each outer glass layer and the quartz content of each insulating layer of the inner glass layer ranges from approximately 3% to 6% by weight, the bending strength can be sufficiently increased. A difference in quartz content of less than approximately 3% by weight may result in a small compressive stress on the outer glass layers and an insufficiently increased bending strength. On the other hand, a difference in quartz content of more than approximately 6% by weight may result in a larger difference in thermal expansion coefficient between the inner glass layer, the magnetic material layers, and the outer glass layers and more cracks in the inner glass layer.

In the electronic component according to the second embodiment of the present disclosure, each outer glass layer may have any thickness and preferably has a thickness in the range of approximately 15 to 45 µm. When each outer glass layer has a thickness of less than approximately 15 µm, stress resulting from the difference in thermal expansion coefficient between the magnetic material layers and the inner glass layer cannot be sufficiently relieved by the outer glass layers, thus causing more cracks in the inner glass layer. On the other hand, when each outer glass layer has a thickness of more than approximately 45 µm, the outer glass layers may not be subjected to sufficient compressive stress and may be easily detached.

In the electronic component according to the second embodiment of the present disclosure, the coil conductor of each coil conductor layer includes a coil pattern, an outer end portion disposed outside the coil pattern, and an inner end portion disposed inside the coil pattern. The coil conductor can be formed by applying an electrically conductive paste to the insulating layer, for example, by printing. The material of the coil conductor is, but not limited to, Ag, for example.

In the electronic component according to the second embodiment of the present disclosure, the number of turns of each coil conductor depends on the desired frequency characteristics and is preferably, but not limited to, 6 or more.

In the electronic component according to the second embodiment of the present disclosure, each coil conductor may have any length (conductor line length of the coil pattern portion) and preferably has almost the same length.

In the electronic component according to the second embodiment of the present disclosure, the pitch (the sum of the linewidth of the coil conductor pattern and the distance to an adjacent coil conductor pattern) of the coil pattern of each coil conductor is not particularly limited and preferably ranges from approximately 28 to 34 µm.

In the electronic component according to the second embodiment of the present disclosure, each coil conductor preferably has a cross-sectional area in the range of approximately 30 to 160 µm$^2$. When each coil conductor has a cross-sectional area of less than approximately 30 µm$^2$, it is difficult to form the coil conductor layer by screen printing, and conductor line failure (disconnection) is likely to occur. On the other hand, when each coil conductor has a cross-sectional area of more than approximately 160 µm$^2$, the number of turns of the coil pattern must be decreased to prevent coil patterns from too closely approaching each other, and desired impedance characteristics may not be achieved.

In the electronic component according to the second embodiment of the present disclosure, the bottom lead-out electrode layer and/or the top lead-out electrode layer has a lead-out electrode on a surface of an insulating layer. The material of the lead-out electrode is, but not limited to, Ag, for example. The material of the insulating layer may be a nonmagnetic material, such as a glass material.

In the electronic component according to the second embodiment of the present disclosure, the primary coil conductor layer is coupled to the bottom lead-out electrode layer or the top lead-out electrode layer through a via-hole conductor, and the secondary coil conductor layer is coupled to the bottom lead-out electrode layer or the top lead-out electrode layer through a via-hole conductor. The material of the via-hole conductor is, but not limited to, Ag, for example.

In the electronic component according to the second embodiment of the present disclosure, the material of the outer electrodes is, but not limited to, Ni or Sn, for example. An underlying electrode may be disposed inside the Ni or Sn electrode layer. The underlying electrode is formed by applying an electrically conductive paste containing a Ag powder and a glass frit to the surface of the multilayer body and firing the paste. The outer electrode is formed by forming a Ni film or a Sn film on the surface of the underlying electrode by plating.

In the electronic component according to the second embodiment of the present disclosure, each of the primary coil conductor layer and the secondary coil conductor layer may include two or more coil conductors. When one coil conductor layer includes two or more coil conductors, each coil conductor preferably has coil patterns that almost overlap in a top view of the multilayer body. Each coil conductor is connected in parallel.

[Method for Producing Electronic Component]

A method for producing an electronic component according to a preferred embodiment of the present disclosure is described below. A method for producing an electronic component according to a preferred embodiment of the present disclosure includes preparing a ceramic green sheet A for an inner glass layer, preparing a ceramic green sheet B for a magnetic material layer, preparing a ceramic green sheet C for an outer glass layer, forming a coil conductor pattern on the ceramic green sheet A to form a coil sheet, forming a lead-out electrode pattern on the ceramic green sheet A to form a lead-out electrode sheet, stacking the ceramic green sheet C, the ceramic green sheet B, the lead-out electrode sheet, the coil sheet, the lead-out electrode sheet, the ceramic green sheet B, and the ceramic green sheet C in this order to form a multilayer body, firing the multilayer body, and forming an outer electrode on the fired multilayer body, wherein the ceramic green sheet A contains quartz and alumina as filler components, the quartz constituting approximately 34% to 37% by weight of the ceramic green sheet A, the alumina constituting approximately 0.5% to 4% by weight of the ceramic green sheet A.

In a method for producing an electronic component according to a preferred embodiment of the present disclosure, first, the ceramic green sheet A for an inner glass layer is formed. For example, a glass material containing at least K, B, and Si and a mixed material of filler components quartz ($SiO_2$) and alumina ($Al_2O_3$) are mixed with an organic binder, such as poly(vinyl butyral), an organic solvent, such as ethanol or toluene, and a dispersant to form a slurry. The ceramic green sheet A is then formed by a doctor blade method, for example. The ceramic green sheet A is fired to form insulating layers of an inner glass layer. The ceramic green sheet B and the ceramic green sheet C can also be formed in the same way. The ceramic green sheet A, the ceramic green sheet B, and the ceramic green sheet C are also collectively referred to as a ceramic green sheet.

The glass material is preferably borosilicate glass. The borosilicate glass has a composition of $SiO_2$: approximately 70% to 85% by weight, $B_2O_3$: approximately 10% to 25% by weight, $K_2O$: approximately 0.5% to 5% by weight, and $Al_2O_3$: approximately 0% to 5% by weight, for example. The borosilicate glass with such a composition has a low relative permittivity and can therefore improve the high-frequency characteristics of the electronic component.

In addition to the glass material, quartz, and alumina, a magnetic material, such as a ferrite material, and a filler component forsterite ($2MgO \cdot SiO_2$) may be contained. With respect to the amount of the filler component to be added, quartz ranges from approximately 34% to 37% by weight of the ceramic green sheet A, and alumina ranges from approximately 0.5% to 4% by weight of the ceramic green sheet A. Quartz has a lower relative permittivity than borosilicate glass and can therefore further improve high-frequency characteristics. Forsterite and alumina have a high bending strength and can improve mechanical strength. Examples of the ferrite material include Ni—Zn—Cu ferrites. Ferrite has high relative permeability and tends to improve impedance characteristics.

The ferrite material may be a Ni—Zn—Cu ferrite raw material (oxide mixed powder) with an average particle size of approximately 0.5 μm produced by mixing oxide raw materials of iron, nickel, zinc, and copper, followed by calcination at approximately 800° C. for approximately 1 hour, pulverization in a ball mill, and drying.

In the formation of the ceramic green sheet B from the ferrite material, to achieve a high L-value (inductance), the ferrite material preferably has a composition of $Fe_2O_3$: approximately 40 to 49.5 mol %, ZnO: approximately 5 to 35 mol %, CuO: approximately 4 to 12 mol %, and the remainder: NiO and minute amounts of additive agents (including incidental impurities).

To form the ceramic green sheet C from the glass material, the amount of the filler component quartz to be added is preferably smaller than the amount in the ceramic green sheet A. To form the ceramic green sheet C, the filler component quartz preferably ranges from approximately 28% to 34% by weight of the ceramic green sheet C, and the filler component alumina ranges from approximately 0.5% to 4% by weight of the ceramic green sheet C.

The ceramic green sheet A is subjected to laser processing to form a via-hole approximately 30 to 40 μm in diameter. The via-hole is filled with a Ag paste. A coil conductor pattern (coil conductor) approximately 11 μm in thickness is formed by screen printing, is dried, and is fired to form a coil sheet for a coil conductor layer.

The ceramic green sheet A is subjected to laser processing to form a via-hole, if necessary, and a lead-out electrode pattern approximately 11 μm in thickness is formed by screen printing, is dried, and is fired to form an electrode sheet for a lead-out electrode layer.

A ceramic green sheet A without a printed coil conductor pattern or lead-out electrode pattern (also collectively referred to as a pattern) is fired to form an insulator layer.

The ceramic green sheet C for a bottom outer glass layer, the ceramic green sheet B for a bottom magnetic material layer, a bottom electrode sheet for a bottom lead-out electrode layer, a primary coil sheet for a primary coil conductor layer, a secondary coil sheet for a secondary coil conductor layer, a tertiary coil sheet for a tertiary coil conductor layer, a parallel primary coil sheet for a parallel primary coil conductor layer, a top electrode sheet for a top lead-out electrode layer, the ceramic green sheet A without a printed pattern, the ceramic green sheet B for a top magnetic material layer, and the ceramic green sheet C for a top outer glass layer are then stacked in this order and are subjected to thermocompression bonding to form a multilayer sheet. The coil sheets and the electrode sheets are stacked such that the coil patterns of the primary coil conductor, the secondary coil conductor, the tertiary coil conductor, and the parallel primary coil conductor almost overlap in the top view, such that corresponding via-holes in each coil sheet overlap in the top view, and such that via-holes are aligned with lead-out electrodes. The multilayer sheet is cut to a predetermined size and is fired to form a multilayer body precursor for a multilayer body.

When an inner magnetic path is formed in a multilayer body, a bottom electrode sheet for a bottom lead-out electrode layer, a primary coil sheet for a primary coil conductor layer, a secondary coil sheet for a secondary coil conductor layer, a tertiary coil sheet for a tertiary coil conductor layer, a parallel primary coil sheet for a parallel primary coil conductor layer, a top electrode sheet for a top lead-out electrode layer, and the ceramic green sheet A without a printed pattern may be stacked and subjected to thermocompression bonding to form a multilayer sheet, a via-hole may be formed in the multilayer sheet at a predetermined position by sandblasting and may be filled with an inner magnetic path paste for the inner magnetic path in a single step, and then the ceramic green sheet B and the ceramic green sheet C may be stacked. Alternatively, in the formation of the coil sheets, a via-hole formed by laser processing of the ceramic green sheet A may be successively filled with the inner magnetic path paste. The inner magnetic path paste is produced by mixing a Ni—Zn—Cu ferrite raw material, an organic binder, such as poly(vinyl butyral), an organic solvent, such as ethanol or toluene, and a dispersant, for example.

After subsequent removal of the binder and firing at a predetermined temperature for a predetermined time, a fired product (multilayer body) is obtained that includes the bottom outer glass layer, the bottom magnetic material layer, the bottom lead-out electrode layer, the primary coil conductor layer, the secondary coil conductor layer, the tertiary coil conductor layer, the parallel primary coil conductor layer, the top lead-out electrode layer, the insulator layer, the top magnetic material layer, and the top outer glass layer stacked in this order. The binder may be removed in the air at a temperature in the range of approximately 350° C. to 500° C. The firing may be performed in the air at a temperature in the range of approximately 850° C. to 920° C.

Preferably, the fired multilayer body, together with an abrasive, is placed in a barrel, and the barrel is rotated to round the corners and edges of the multilayer body by barrel polishing. Barrel polishing can remove burrs formed on a section of the multilayer body and round the corners and edges of the multilayer body, thus improving mechanical strength.

Outer electrodes are formed on the multilayer body at predetermined positions. Thus, an electronic component according to a preferred embodiment of the present disclosure is produced. Outer electrodes may be formed on the surface of the multilayer body, for example, by forming three underlying electrodes on each of a first end surface and a second end surface of the multilayer body and forming a plated electrode to cover each underlying electrode. The underlying electrodes may be formed, for example, by applying an underlying electrode paste to a surface of the multilayer body and firing the underlying electrode paste at approximately 900° C. The underlying electrode paste contains a mixture of a Ag powder and a predetermined amount of glass frit.

A Ni film and a Sn film each with a predetermined thickness are successively formed on the underlying electrodes by plating to form the outer electrodes.

Thus, the electronic component according to the first embodiment of the present disclosure can be produced. The electronic component according to the second embodiment of the present disclosure can be produced by substituting the method for forming the multilayer sheet by thermocompression bonding of the ceramic green sheet C for a bottom outer glass layer, the ceramic green sheet B for a bottom magnetic material layer, a bottom electrode sheet for a bottom lead-out electrode layer, a primary coil sheet for a primary coil conductor layer, a secondary coil sheet for a secondary coil conductor layer, the ceramic green sheet A without a printed pattern, the ceramic green sheet B for a top magnetic material layer, and the ceramic green sheet C for a top outer glass layer stacked in this order. The bottom electrode sheet for a bottom lead-out electrode layer is optional. Instead of the bottom electrode sheet, a top electrode sheet for a top lead-out electrode layer may be formed between a parallel primary coil sheet and the ceramic green sheet B for a top magnetic material layer. Alternatively, both the bottom electrode sheet and the top electrode sheet may be formed. The top electrode sheet for a top lead-out electrode layer is preferably disposed between the secondary coil sheet for a secondary coil conductor layer and the ceramic green sheet A without a printed pattern.

EXAMPLES

An electronic component according to a preferred embodiment of the present disclosure and a method for producing an electronic component according to a preferred embodiment of the present disclosure are more specifically disclosed in the following examples. However, the present disclosure is not limited to these examples.

[Production of Ceramic Green Sheet A]

(1) A glass material powder containing 2.0% by weight $K_2O$, 20.0% by weight $B_2O_3$, 76.0% by weight $SiO_2$, and 2.0% by weight $Al_2O_3$ was prepared.

(2) 63.3 parts by weight of a glass material powder, 34.1 parts by weight of a filler component quartz, and 2.6 parts by weight of a filler component alumina were mixed to prepare a glass raw powder.

(3) The glass raw powder, an organic binder (poly(vinyl butyral) resin), organic solvents (ethanol and toluene), and PSZ balls in a pot mill were sufficiently wet blended and ground to prepare a slurry.

(4) The slurry was formed into a sheet by a doctor blade method. 225 mm×225 mm rectangular ceramic green sheets A with a thickness of 20 μm (sample No. 1) were punched out from the sheet.

As listed in Table 1, the glass material, quartz, and alumina contents were changed to form ceramic green sheets A (sample Nos. 2 to 9).

TABLE 1

| | Composition of ceramic green sheet A [wt %] | | |
|---|---|---|---|
| Sample No. | Glass frit | Quartz | Alumina |
| 1 | 63.3 | 34.1 | 2.6 |
| 2 | 60.6 | 36.9 | 2.5 |
| 3 | 62.2 | 34.1 | 3.7 |
| 4 | 64.3 | 34.7 | 1.0 |
| 5 | 64.6 | 34.8 | 0.6 |
| 6 | 57.4 | 40.2 | 2.4 |
| 7 | 66.2 | 31.1 | 2.7 |
| 8 | 60.3 | 34.1 | 5.6 |
| 9 | 64.8 | 34.9 | 0.3 |

[Production of Ceramic Green Sheet B]

(1) A ferrite raw material (calcined powder) containing predetermined amounts of $Fe_2O_3$, NiO, ZnO, and CuO was prepared.

(2) Predetermined amounts of organic binder (poly(vinyl butyral) resin) and organic solvents (ethanol and toluene) were added to 100 parts by weight of the calcined powder, which together with PSZ balls was then placed in a pot mill and was sufficiently wet blended and ground to prepare a magnetic material slurry.

(3) The magnetic material slurry was formed into a sheet by a doctor blade method. 225 mm×225 mm rectangular ceramic green sheets B with a thickness of 20 μm (sample No. 10) were punched out from the sheet.

[Production of Ceramic Green Sheet C]

(1) A glass material powder containing 2.0% by weight $K_2O$, 20.0% by weight $B_2O_3$, 76.0% by weight $SiO_2$, and 2.0% by weight $Al_2O_3$ was prepared.

(2) 63.3 parts by weight of a glass material powder, 34.1 parts by weight of a filler component quartz, and 2.6 parts by weight of a filler component alumina were mixed to prepare a glass raw powder.

(3) The glass raw powder, an organic binder (poly(vinyl butyral) resin), organic solvents (ethanol and toluene), and PSZ balls in a pot mill were sufficiently wet blended and ground to prepare a slurry.

(4) The slurry was formed into a sheet by a doctor blade method. 225 mm×225 mm rectangular ceramic green sheets C with a thickness of 22 μm (sample No. 11) were punched out from the sheet.

As listed in Table 2, the glass material, quartz, and alumina contents were changed to form ceramic green sheets C (sample No. 12).

TABLE 2

| | Composition of ceramic green sheet C [wt %] | | |
|---|---|---|---|
| Sample No. | Glass frit | Quartz | Alumina |
| 11 | 63.3 | 34.1 | 2.6 |
| 12 | 66.2 | 31.1 | 2.7 |

Example 1

[Production of Electrode Sheets and Coil Sheets]

A predetermined portion of the ceramic green sheets A (sample No. 1) was irradiated with a laser beam to form a via-hole, which was then filled with an electrically conductive paste to form a via-conductor. A lead-out electrode and a coil conductor each in a predetermined shape were then printed to form a bottom electrode sheet for a bottom lead-out electrode layer, a primary coil sheet for a primary coil conductor layer, a secondary coil sheet for a secondary coil conductor layer, a tertiary coil sheet for a tertiary coil conductor layer, a parallel primary coil sheet for a parallel primary coil conductor layer, and a top electrode sheet for a top lead-out electrode layer. The number of turns of the primary coil sheet, secondary coil sheet, tertiary coil sheet, and parallel primary coil sheet was 8.

[Production of Multilayer Body Precursor]

The ceramic green sheet C (sample No. 12), the ceramic green sheet B, the bottom electrode sheet, the primary coil sheet, the secondary coil sheets (two), the tertiary coil sheets (two), the parallel primary coil sheet, the top electrode sheet, the ceramic green sheet A (sample No. 1), the ceramic green sheet B, and the ceramic green sheet C (sample No. 12) were stacked in this order and were subjected to thermocompression bonding at 80° C. and at 100 MPa to form a multilayer body sheet having a coil conductor pattern and an electrode pattern as illustrated in FIGS. 4 and 5. The multilayer sheet was cut with a dicer to prepare pieces of a multilayer body precursor.

[Production of Multilayer Body]

The multilayer body precursor was fired at 880° C. for 1.5 hours to form 60 multilayer bodies according to Example 1. The average sizes of the 60 multilayer bodies measured with a micrometer were L=0.92 mm, W=0.70 mm, and T=0.40 mm

[Measurement of Thicknesses of Inner Glass Layer, Magnetic Material Layer, and Outer Glass Layer]

In three multilayer bodies according to Example 1, each multilayer body was covered with a resin such that an LT plane defined by the length L and the height T was exposed. The multilayer bodies were ground to substantially the center thereof with a grinder, and polishing sagging was removed by ion milling from the surface. An image of the surface was taken with a scanning electron microscope. The average thicknesses of the inner glass layer, the magnetic material layer, and the outer glass layer were measured as follows: inner glass layer: 160 μm, magnetic material layer: 70 μm, and outer glass layer: 42 μm.

Examples 2 to 6 and Comparative Examples 1 to 4

Multilayer bodies according to Examples 2 to 6 and Comparative Examples 1 to 4 were produced in the same manner as Example 1 except that the sample numbers of the ceramic green sheet A and the ceramic green sheet C were changed as listed in Table 3.

TABLE 3

| | Sample No. | | Difference between quartz content of insulating layer of inner glass layer and quartz content of outer glass layer [wt %] | Evaluation | |
|---|---|---|---|---|---|
| | Ceramic green sheet A | Ceramic green sheet C | | Platability | Flexibility |
| Example 1 | 1 | 12 | 3.0 | Good | Good |
| Example 2 | 2 | 12 | 5.8 | Good | Good |
| Example 3 | 3 | 12 | 3.0 | Good | Good |
| Example 4 | 4 | 12 | 3.6 | Good | Good |
| Example 5 | 5 | 12 | 3.7 | Good | Good |
| Example 6 | 1 | 11 | 0.0 | Good | Poor |
| Comparative example 1 | 6 | 12 | 9.1 | Poor | — |
| Comparative example 2 | 7 | 12 | 0.0 | Poor | — |
| Comparative example 3 | 8 | 12 | 3.0 | Poor | — |
| Comparative example 4 | 9 | 12 | 3.8 | Poor | — |

[Platability Test]

An electrically conductive paste for an outer electrode, which contained a Ag powder and a glass frit, was applied to the surface of each of the multilayer bodies according to Examples 1 to 6 and Comparative Examples 1 to 4 and was heated at 810° C. for 1 minute to form underlying electrodes for outer electrodes. The multilayer bodies with the underlying electrodes were then immersed successively in a Ni plating solution and a Sn plating solution to form outer electrodes (first to sixth outer electrodes). Thus, electronic components according to Examples 1 to 6 and Comparative Examples 1 to 4 were produced. Thirty pieces of the electronic components were covered with a resin such that the LT plane was exposed, and were ground with a grinder. Portions where lead-out electrodes were formed were checked for a crack with a SEM. When at least one of the thirty electronic components had a crack, the platability was rated poor. When all the thirty electronic components had no crack, the platability was rated good. Table 3 shows the results.

[Flexibility Test]

Each of 30 electronic components according to Examples 1 to 5 was soldered to a central portion of a 100 mm×40 mm bending strength test substrate (glass epoxy substrate) with a thickness of 1 mm A surface opposite the surface to which the electronic component was soldered was bent 3 mm at 0.5 mm/s to test the electronic component for breakage. When at least one of the thirty electronic components was broken, the flexibility was rated poor. When all the thirty electronic components were not broken, the flexibility was rated good. Table 3 shows the results. Electronic components with poor platability were not subjected to the flexibility test (indicated by "-" in Table 3).

The results in Table 3 show that the electronic components in which the quartz content of each insulating layer of the inner glass layer ranged from approximately 34% to 37% by weight, the glass material content ranged from approximately 60% to 65% by weight, and the alumina content ranged from approximately 0.5% to 4% by weight had good platability and fewer cracks in the production. The quartz content of each outer glass layer lower than the quartz content of each insulating layer of the inner glass layer resulted in a high bending strength.

An electronic component according to a preferred embodiment of the present disclosure can be suitably used in common mode choke coils, inductor devices, and LC composite components, for example.

While preferred embodiments of the disclosure have been described above, it is to be understood that variations and modifications will be apparent to those skilled in the art without departing from the scope and spirit of the disclosure. The scope of the disclosure, therefore, is to be determined solely by the following claims.

What is claimed is:

1. An electronic component comprising an outer electrode on a surface of a multilayer body, the multilayer body including an inner glass layer, a magnetic material layer on a top surface and a bottom surface of the inner glass layer, and an outer glass layer on a top surface and a bottom surface of the magnetic material layer, wherein the inner glass layer includes a coil multilayer body, a top lead-out electrode layer on a top surface of the coil multilayer body, and a bottom lead-out electrode layer on a bottom surface of the coil multilayer body, the coil multilayer body including a plurality of coil conductor layers, each of the coil conductor layers including a coil conductor having a coil pattern on a surface of an insulating layer, the top lead-out electrode layer including a lead-out electrode on a surface of an insulating layer, the bottom lead-out electrode layer including a lead-out electrode on a surface of an insulating layer, and the coil multilayer body includes a primary coil conductor layer including a primary coil conductor, a secondary coil conductor layer including a secondary coil conductor, a tertiary coil conductor layer including a tertiary coil conductor, and a parallel primary coil conductor layer including a parallel primary coil conductor stacked in this order on the bottom surface thereof, the outer electrode includes a first outer electrode, a second outer electrode, a third outer electrode, a fourth outer electrode, a fifth outer electrode, and a sixth outer electrode, the primary coil conductor is coupled to the first outer electrode and the fourth outer electrode, the secondary coil conductor is coupled to the second outer electrode and the fifth outer electrode, the tertiary coil conductor is coupled to the third outer electrode and the sixth outer electrode, the parallel primary coil conductor is coupled to the first outer electrode and the fourth outer electrode, the primary coil conductor is connected in parallel to the parallel primary coil conductor, the insulating layers of the inner glass layer and the outer glass layers contain a dielectric glass material that contains a glass material containing at least K, B, and Si, quartz, and alumina, the glass material content of each insulating layer of the inner glass layer ranges from approximately 60% to 65% by weight, the quartz content of each insulating layer of the inner glass layer ranges from approximately 34% to 37% by weight, and the alumina content of each insulating layer of the inner glass layer ranges from approximately 0.5% to 4% by weight.

2. The electronic component according to claim 1, wherein each of the primary coil conductor, the secondary coil conductor, the tertiary coil conductor, and the parallel primary coil conductor includes a coil pattern with two end portions, one end portion of the coil pattern being an inner end portion disposed inside the coil pattern, the other end portion of the coil pattern being an outer end portion disposed outside the coil pattern, the inner end portions of the primary coil conductor and the secondary coil conductor are coupled to the bottom lead-out electrode layer through a first via-hole conductor and a second via-hole conductor disposed inside the coil pattern, the inner end portions of the tertiary coil conductor and the parallel primary coil conductor are coupled to the top lead-out electrode layer through a third via-hole conductor and a fourth via-hole conductor disposed inside the coil pattern, in a top view of the multilayer body, the first via-hole conductor and the second via-hole conductor at least partly overlap one of the third via-hole conductor and the fourth via-hole conductor, and in all the coil conductor layers of the multilayer body, the number of via-hole conductors inside each coil pattern is two or less.

3. The electronic component according to claim 2, wherein the coil patterns of the primary coil conductor layer and the parallel primary coil conductor layer almost overlap in a top view of the coil multilayer body.

4. The electronic component according to claim 2, wherein the secondary coil conductor layer includes a plurality of secondary coil conductors having coil patterns that almost overlap in a top view of the coil multilayer body.

5. The electronic component according to claim 2, wherein the tertiary coil conductor layer includes a plurality of tertiary coil conductors having coil patterns that almost overlap in a top view of the coil multilayer body.

6. The electronic component according to claim 2, wherein the quartz content of each outer glass layer is lower than the quartz content of each insulating layer of the inner glass layer.

7. The electronic component according to claim 1, wherein the coil patterns of the primary coil conductor layer and the parallel primary coil conductor layer almost overlap in a top view of the coil multilayer body.

8. The electronic component according to claim 1, wherein the secondary coil conductor layer includes a plurality of secondary coil conductors having coil patterns that almost overlap in a top view of the coil multilayer body.

9. The electronic component according to claim 1, wherein the tertiary coil conductor layer includes a plurality of tertiary coil conductors having coil patterns that almost overlap in a top view of the coil multilayer body.

10. The electronic component according to claim 1, wherein the quartz content of each outer glass layer is lower than the quartz content of each insulating layer of the inner glass layer.

11. The electronic component according to claim 10, wherein a difference between the quartz content of each outer glass layer and the quartz content of each insulating layer of the inner glass layer ranges from approximately 3% to 6% by weight.

12. The electronic component according to claim 1, wherein the alumina content of each insulating layer of the inner glass layer ranges from approximately 0.6% to 1% by weight.

13. The electronic component according to claim 1, wherein each of the outer glass layers has a thickness in the range of approximately 15 to 45 μm.

* * * * *